United States Patent
Suzuki et al.

(10) Patent No.: US 7,422,942 B2
(45) Date of Patent: Sep. 9, 2008

(54) METHOD FOR FABRICATING A SEMICONDUCTOR DEVICE HAVING AN INSULATION FILM WITH REDUCED WATER CONTENT

(75) Inventors: Kousuke Suzuki, Kawasaki (JP); Katsuyuki Karakawa, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/798,366

(22) Filed: May 14, 2007

(65) Prior Publication Data

US 2007/0287250 A1  Dec. 13, 2007

Related U.S. Application Data

(62) Division of application No. 10/793,862, filed on Mar. 8, 2004, now Pat. No. 7,232,720.

(51) Int. Cl.
*H01L 21/8242* (2006.01)
*H01L 21/3205* (2006.01)
*H01L 21/4763* (2006.01)

(52) U.S. Cl. .............. 438/252; 438/586; 438/627; 438/637; 438/630; 257/E21.438; 257/E21.507; 257/E21.577

(58) Field of Classification Search ............ 438/252, 438/586, 627, 637; 257/E21.438, E21.507, 257/E21.577
See application file for complete search history.

(56) References Cited

U.S. PATENT DOCUMENTS

| | | | | |
|---|---|---|---|---|
| 4,292,728 A | * | 10/1981 | Endo | ............ 438/151 |
| 4,612,207 A | | 9/1986 | Jansen | |
| 5,296,400 A | | 3/1994 | Park et al. | |
| 5,485,420 A | | 1/1996 | Lage et al. | |
| 5,610,099 A | | 3/1997 | Stevens et al. | |
| 5,626,679 A | * | 5/1997 | Shimizu et al. | ...... 118/723 MR |
| 6,017,614 A | | 1/2000 | Tsai et al. | |
| 6,069,400 A | * | 5/2000 | Kimura et al. | ............ 257/633 |

FOREIGN PATENT DOCUMENTS

| | | |
|---|---|---|
| JP | 57-128058 | 8/1982 |
| JP | 2-27716 | 1/1990 |
| JP | 2-87531 | 3/1990 |
| JP | 2-262358 | 10/1990 |
| JP | 2-303168 | 12/1990 |
| JP | 3-285330 | 12/1991 |

(Continued)

OTHER PUBLICATIONS

Wolf. S; Silicon Processing for the VLSI Era, vol. 2; Lattice Press, Sunset Beach, CA, 1990; pp. 194-198.

*Primary Examiner*—Walter L. Lindsay, Jr.
*Assistant Examiner*—Ron E Pompey
(74) *Attorney, Agent, or Firm*—Westerman, Hattori, Daniels & Adrian, LLP.

(57) ABSTRACT

A semiconductor device having a self-aligned contact hole is formed by providing a side wall oxide film on a gate electrode, covering the gate electrode and the side wall oxide film by an oxide film and further covering the oxide film by a nitride film, wherein the oxide film is formed by a plasma CVD process with a reduced plasma power such that the $H_2O$ content in the oxide film is less than about 2.4 wt %.

12 Claims, 20 Drawing Sheets

FOREIGN PATENT DOCUMENTS

| | | |
|---|---|---|
| JP | 4-69968 | 3/1992 |
| JP | 4-154124 | 5/1992 |
| JP | 4-357828 | 12/1992 |
| JP | 5-55475 | 3/1993 |
| JP | 5-160067 | 6/1993 |
| JP | 5-347274 | 12/1993 |
| JP | 6-151736 | 5/1994 |
| JP | 6-204420 | 7/1994 |
| JP | 7-38104 | 2/1995 |
| JP | 7-115198 | 5/1995 |
| JP | 7-135208 | 5/1995 |
| JP | 7-153950 | 6/1995 |
| JP | 7-183253 | 7/1995 |
| JP | 7-321102 | 12/1995 |
| JP | 8-222633 | 8/1996 |
| JP | 8-255903 | 10/1996 |
| JP | 8-274187 | 10/1996 |

\* cited by examiner

METHOD FOR FABRICATING A SEMICONDUCTOR DEVICE HAVING AN INSULATION FILM WITH REDUCED WATER CONTENT

RELATED APPLICATION

This application is a Divisional Application of U.S. patent application Ser. No. 10/793,862 filed on Mar. 8, 2004, now U.S. Pat. No. 7,232,720 which is a Divisional Application of U.S. patent application Ser. No. 09/045,118 filed on Mar. 20, 1998 now U.S. Pat. No. 6,878,594, which is hereby incorporated by reference in its entirety. Priority under 35 U.S.C. §§ 120 and 121 is hereby claimed for benefit of the filing date of U.S. patent application Ser. No. 09/045,118.

BACKGROUND OF THE INVENTION

The present generally relates to semiconductor devices and more particularly to a miniaturized high-speed semiconductor device and a fabrication process thereof.

With the development in the art of device miniaturization, the operational speed of field-effect semiconductor devices such as a MOS transistor is increasing every year. On the other hand, such an extremely miniaturized semiconductor device tends to suffer from the problem of so-called short-channel effect, which appears conspicuously in such a miniaturized device having a short gate length, due to the deviation from the classical gradual channel approximation model. When a short-channel effect appears, there arise problems such as deviation of threshold voltage. In the worst case, the drain current becomes no longer controllable by the gate voltage.

Thus, it has been practiced in conventional miniaturized field effect semiconductor devices to reduce the thickness of diffusion regions as small as possible in correspondence to the reduced gate length of the device.

As such an extremely shallow diffusion region tends to cause a problem of increased resistance, it is proposed to provide a layer of low-resistance silicide such as $CoSi_2$ on the surface of the diffusion region by conducting a self-aligned process. See for example Japanese Laid-Open Patent Publication 7-115198.

Meanwhile, there is proposed a process of forming an extremely miniaturized semiconductor device that includes a self-aligned contact structure. See for example Japanese Laid-Open Patent Publication 8-274278.

FIGS. 1A-1H show the foregoing conventional process of forming a self-aligned contact structure.

Referring to FIG. 1A, a gate oxide film 2 and a field oxide film 2A are formed on a p-type Si substrate 1, and a polysilicon layer 3 is deposited on the structure of FIG. 1A in the step of FIG. 1B. The polysilicon layer 3 thus deposited is then doped to the $n^+$-type by an ion-implantation of $P^+$ ions and patterned in the step of FIG. 1C to form a gate electrode 3A. In the step of FIG. 1C, an ion implantation process of $As^+$ is further conducted while using the gate electrode 3A as a mask, to form shallow diffusion regions 1A and 1B of the $n^+$-type at both lateral sides of the gate electrode 3A by a self-alignment process.

Next, in the step of FIG. 1D, an $SiO_2$ film is deposited on the structure of FIG. 1C uniformly by a CVD process, followed by an anisotropic etching process acting substantially perpendicularly to the surface of the substrate 1 to form side wall oxide films 3a and 3b on both side walls of the gate electrode 3A. Further, additional diffusion regions 1C and 1D are formed so as to partially overlap the diffusion region 1A or 1B by conducting an ion-implantation process of $As^+$ while using the gate electrode 3A and the side-wall oxide films 3a and 3b as a mask, to form a so-called LDD (lightly doped drain) structure.

Next, in the step of FIG. 1E, an SiN film 4 is deposited uniformly on the structure of FIG. 1D by a CVD process or a sputtering process, followed by the step of FIG. 1F in which an interlayer insulation film 5 of $SiO_2$, PSG or BPSG is deposited on the foregoing SiN film 4. The interlayer insulation film 5 is further formed with a contact hole 5A in correspondence to the diffusion region 1C by an anisotropic dry etching process. Similarly, a contact hole 5B is formed in the insulation film 5 in correspondence to the diffusion region 1D. The contact hole 5A or 5B may be formed with a size sufficiently larger than the size of the corresponding diffusion region 1C or 1D and can be formed easily by a photolithography without experiencing a difficulty of resolution limit, which generally arises when forming a deep contact hole.

The dry etching process for forming the contact holes 5A and 5B stops spontaneously upon the exposure of the underlying SiN layer 4 as indicated in FIG. 1F. Thus, a step of FIG. 1G is conducted for removing the exposed SiN film 4 by an etching process. Further, a step of FIG. 1H is conducted for removing a part of the gate oxide film 2 that is now exposed at the bottom of the contact holes 5A and 5B, by conducting a selective etching process with respect to the Si substrate 1. As a result of the step of FIG. 1H, minute openings 1c and 1d respectively exposing the diffusion regions 1C and 1D are formed.

It should be noted that the opening 1c is defined by the field oxide film 2A and the side wall oxide film 3a. Similarly, the opening 1d is defined by the other field oxide film 2A and the side wall oxide film 3b. In other words, the openings 1c and 1d are formed in a self-aligned manner, without using a mask process. This means that the openings 1c and 1d can be formed reliably and with reproducibility without restrained from the problem of resolution limit of exposure even when the semiconductor device is extremely miniaturized. Further, as explained already, it is not necessary to miniaturize the contact holes 5A and 5B. Thus, the photolithography for forming the contact holes 5A and 5B can be conducted easily.

Thus, the foregoing self-aligned process of FIGS. 1A-1H is advantageous for forming extremely miniaturized semiconductor devices. As already noted, it is desired in such extremely miniaturized high-speed semiconductor devices to form a low-resistance silicide layer on the surface of the diffusion regions 1C and 1D so as to compensate for the unwanted increase of the resistance, which tends to occur in such extremely shallow diffusion regions.

One possibility of forming such a silicide layer may include the steps of: removing the gate oxide film 2 for the part covering the diffusion regions 1C and 1D; depositing a metal layer of Co or Ti on the exposed surface of the diffusion regions 1C and 1D; and forming a silicide in a self-aligned manner by causing a reaction between the metal layer and the diffusion region. The remaining metal layer may be removed by an etching process. See for example the process disclosed in the Japanese Laid-Open Patent Publication 7-115198.

In such a conventional process of forming a silicide layer, however, there is a substantial risk that the etching process, used in the step of FIG. 1G for removing the SiN film 4 from the bottom of the contact holes 5A and 5B, may proceed further to the diffusion region 1C or 1D and cause a damage thereto.

In order to be sure that such a damage is not to be caused, it is necessary to deposit another $SiO_2$ film in the step of FIG. 1E before depositing the SiN film 4, as an etching stopper. It should be noted that the additional SiO$_2$ film acts as an etching stopper for the etching process employed for removing the SiN film 4, and the problem of damaging of the diffusion region 1C or 1D is positively eliminated. Further, such an additional SiO$_2$ film can be easily removed by a selective etching process without causing a damage to the diffusion region 1C or 1D.

It is generally practiced to form such an SiO$_2$ etching stopper layer by a CVD process. In the case of the a semiconductor device in which the silicide layer is formed on the surface of a shallow diffusion region, however, there is a substantial risk that the metal elements constituting the silicide may cause a diffusion and reach the Si substrate because of the high deposition temperature employed in the CVD process. Thus, it has been necessary to form the additional SiO$_2$ film by using a plasma CVD process at a low temperature of typically about 500° C. or less.

On the other hand, the SiO$_2$ etching stopper film thus deposited at a low temperature plasma CVD process tends to contain H$_2$O therein. As the SiO$_2$ etching stopper is covered by the SiN film 4 in the step of FIG. 1G, it is difficult for the H$_2$O molecules in the SiO$_2$ etching stopper film to escape therefrom once covered by the SiN film 4. Thereby, the H$_2$O molecules tend to be confined in the SiO$_2$ film in the form of OH and H ions. It should be noted that the OH ions in the SiO$_2$ etching stopper film, when reached to a region close to the gate oxide film 2 by way of diffusion, may form a surface state which captures electrons.

FIG. 2 shows an example of the self-aligned contact structure that uses an SiO$_2$ etching stopper film, wherein those parts corresponding to the parts described previously are designated by the same reference numerals and the description thereof will be omitted.

Referring to FIG. 2, there is provided an etching stopper film 6 of SiO$_2$ on the gate oxide film 2 by a low temperature plasma CVD process such that the SiO$_2$ film 6 covers the gate electrode 3A including the side wall oxide films 3a and 3b. Further, the SiN film 4 is provided so as to cover the SiO$_2$ film 6.

In such a structure, the escaping of H$_2$O from the SiO$_2$ film 6 is difficult as already noted, due to the existence of the SiN film 4 covering the SiO$_2$ film 6. Thus, there is a substantial risk that the OH ions confined in the SiO$_2$ film 6 cause a diffusion toward the interface between the gate oxide film 2 and the Si substrate 1. As noted already, the OH ions thus reached the foregoing interface may form a surface state that captures electrons, particularly the hot electrons created in the channel region right underneath the gate electrode 3A. The capturing of the hot electrons by the surface state may in turn cause an unwanted shift of threshold voltage of the semiconductor device.

It should be noted that the self-aligned contact structure of FIGS. 1A-1H may also be used in a high-speed semiconductor memory device that has a so-called local interconnection structure such as SRAM. In the semiconductor device having such a local interconnection structure, there tends to occur a reaction between the metal layer forming the local interconnection structure and a silicide that is formed on the surface of the diffusion region. In order to avoid the foregoing problem, it is necessary to conduct the deposition of the etching stopper film 6 at a low temperature. However, such a low temperature deposition of the SiO$_2$ etching stopper film 6 causes the problem explained above.

SUMMARY OF THE INVENTION

Accordingly, it is a general object of the present invention to provide a novel and useful semiconductor device and a fabrication process thereof wherein the foregoing problems are eliminated.

Another and more specific object of the present invention is to provide a semiconductor device having a self-aligned contact structure and a fabrication process thereof wherein the H$_2$O content in the SiO$_2$ etching stopper film that is provided underneath a nitride etching stopper film is minimized without causing a diffusion of a metal element from the silicide layer formed on a diffusion region to the interior of the diffusion region, or without causing a reaction between the silicide layer formed on the surface of the diffusion region and a local interconnection layer contacting the diffusion region.

Another object of the present invention is to provide a method of fabricating a semiconductor device, comprising the steps of:

forming a gate electrode on a substrate;

forming a diffusion region in said substrate adjacent to said gate electrode;

forming a side wall oxide film on a side wall of said gate electrode;

forming an interlayer insulation film on said substrate such that said interlayer insulation film covers said gate electrode and further said side wall oxide film; and forming a self-aligned opening in said interlayer insulation film such that said self-aligned opening exposes said diffusion region;

said step of forming said self-aligned opening comprising the steps of:

forming a first insulation film of an oxide such that said first insulation film covers said side wall oxide film and said diffusion region;

depositing a second insulation film having a composition different from a composition of said first insulation film, on said first insulation film;

forming said interlayer insulation film on said second insulation film;

forming a contact hole in said interlayer insulation film in correspondence to said diffusion region by an etching process while using said second insulation film as an etching stopper;

removing said second insulation film exposed at a bottom of said contact hole by an etching process while using said first insulation film as an etching stopper; and removing said first insulation film exposed at a bottom of said contact hole selectively with respect to said diffusion region;

wherein said step of forming said first insulation film is conducted by a plasma CVD process, with a high-frequency power set smaller than a high-frequency power in which said first insulation film contains H$_2$O with an amount of about 2.4 wt %.

Another object of the present invention is to provide a semiconductor device, comprising:

a substrate;

a gate electrode provided on said substrate;

a diffusion region formed in said substrate adjacent to said gate electrode;

a side-wall insulation film formed on a side wall of said gate electrode; and a self-aligned contact hole defined by said side-wall oxide film and exposing said diffusion region;

wherein said semiconductor device further includes:

a first insulation film provided on said gate electrode so as to cover said side wall oxide film partially;

a second insulation film having a composition different from a composition of said first insulation film and provided on said first insulation film;

an interlayer insulation film deposited on said second insulation film;

a contact hole formed in said interlayer insulation film, said contact hole extending through said first and second insulation films and exposing said self-aligned contact hole;

said first insulation film contains $H_2O$ with an amount smaller than about 2.4 wt %.

According to the present invention, the formation of $H_2O$ in the plasma is suppressed in the low-power plasma CVD process used for forming the first insulation film, by suppressing the high-frequency plasma power. Thereby, the amount of $H_2O$ incorporated into the first insulation film is successfully reduced below about 2.4 wt %, preferably below about 1.1 wt %. As the first insulation film is formed at a low temperature in the present invention, the problem of thermal diffusion of the metal element contained in the silicide layer covering the surface of the diffusion region into the interior of the diffusion region, is successfully avoided.

Another object of the present invention is to provide a method of fabricating a semiconductor device, comprising the steps of:

forming a gate electrode on a substrate;

forming a diffusion region in said substrate adjacent to said gate electrode;

forming a side wall oxide film on a side wall of said gate electrode;

forming an interlayer insulation film on said substrate such that said interlayer insulation film covers said gate electrode and further said side wall oxide film; and forming a self-aligned opening in said interlayer insulation film such that said self-aligned opening exposes said diffusion region;

said step of forming said self-aligned opening comprising the steps of:

forming a first insulation film of an oxide such that said first insulation film covers said side wall oxide film and said diffusion region;

depositing a second insulation film having a composition different from a composition of said first insulation film, on said first insulation film;

forming said interlayer insulation film on said second insulation film;

forming a contact hole in said interlayer insulation film in correspondence to said diffusion region by an etching process while using said second insulation film as an etching stopper;

removing said second insulation film exposed at a bottom of said contact hole by an etching process while using said first insulation film as an etching stopper; and removing said first insulation film exposed at a bottom of said contact hole selectively with respect to said diffusion region;

wherein said step of forming said first insulation film is conducted by a CVD process that uses $SiH_4$ and $N_2O$ as source gases.

According to the present invention, the proportion of the Si—H bond in the first insulation film is increased when forming the first insulation film by a plasma CVD process or a high-temperature CVD process, by increasing the proportion of $N_2O$ with respect to $SiH_4$. Thereby, the formation of $H_2O$ in the deposition chamber is successfully reduced and so is the amount of $H_2O$ in the first insulation film.

Another object of the present invention is to provide a method of fabricating a semiconductor device, comprising the steps of:

forming a gate electrode on a substrate;

forming a diffusion region in said substrate adjacent to said gate electrode;

forming a side wall oxide film on a side wall of said gate electrode;

forming an interlayer insulation film on said substrate such that said interlayer insulation film covers said gate electrode and further said side wall oxide film; and forming a self-aligned opening in said interlayer insulation film such that said self-aligned opening exposes said diffusion region;

said step of forming said self-aligned opening comprising the steps of:

forming a first insulation film of an oxide such that said first insulation film covers said side wall oxide film and said diffusion region;

depositing a second insulation film having a composition different from a composition of said first insulation film, on said first insulation film;

forming said interlayer insulation film on said second insulation film;

forming a contact hole in said interlayer insulation film in correspondence to said diffusion region by an etching process while using said second insulation film as an etching stopper;

removing said second insulation film exposed at a bottom of said contact hole by an etching process while using said first insulation film as an etching stopper; and removing said first insulation film exposed at a bottom of said contact hole selectively with respect to said diffusion region;

wherein said step of forming said first insulation film is conducted by depositing a silicate glass containing P.

Another object of the present invention is to provide a semiconductor device, comprising:

a substrate;

a gate electrode provided on said substrate;

a diffusion region formed in said substrate adjacent to said gate electrode;

a side-wall insulation film formed on a side wall of said gate electrode; and a self-aligned contact hole defined by said side-wall oxide film and exposing said diffusion region;

wherein said semiconductor device further includes:

a first insulation film provided on said gate electrode so as to cover said side wall oxide film partially;

a second insulation film having a composition different from a composition of said first insulation film and provided on said first insulation film;

an interlayer insulation film deposited on said second insulation film;

a contact hole formed in said interlayer insulation film, said contact hole extending through said first and second insulation films and exposing said self-aligned contact hole;

said first insulation film is formed of PSG containing P with an amount of about 6 wt % or less.

Another object of the present invention is to provide a semiconductor device, comprising:

a substrate;

a gate electrode provided on said substrate;

a diffusion region formed in said substrate adjacent to said gate electrode;

a side-wall insulation film formed on a side wall of said gate electrode; and a self-aligned contact hole defined by said side-wall oxide film and exposing said diffusion region;

wherein said semiconductor device further includes:

a first insulation film provided on said gate electrode so as to cover said side wall oxide film partially;

a second insulation film having a composition different from a composition of said first insulation film and provided on said first insulation film;

an interlayer insulation film deposited on said second insulation film;

a contact hole formed in said interlayer insulation film, said contact hole extending through said first and second insulation films and exposing said self-aligned contact hole;

said first insulation film is formed of BPSG containing B with an amount of about 4 wt % or less.

According to the present invention, the amount of $H_2O$ in the first insulation film is successfully reduced by the gettering action of P or B that is contained in the PSG or BPSG forming the first insulation film. Even when a high-temperature CVD process is used for forming the first insulation film, the problem of diffusion of the metal elements from the silicide is successfully avoided by employing a rapid heating process. Thereby, it is possible to reduce the resistance of very shallow diffusion region of a highly miniaturized high-speed semiconductor device.

Other objects and further features of the present invention will become apparent from the following detailed description when read in conjunction with the attached drawings.

DETAILED DESCRIPTION OF THE PREFERRED EMBODIMENTS

[Principle]

FIGS. 3-14 are diagrams showing the content of $H_2O$ incorporated into an $SiO_2$ film when the $SiO_2$ film is formed by a plasma CVD process, wherein FIGS. 3-14 show the result obtained by a TDS (thermal desorption spectroscopy).

Figure 3:
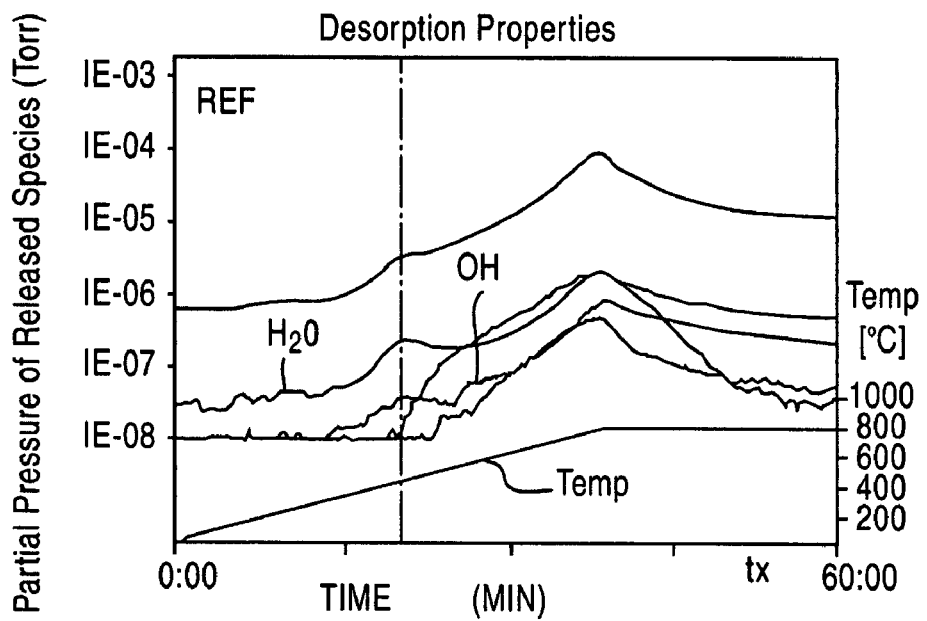
FIG. 3 is a diagram showing the principle of the present invention.
Figure 4:
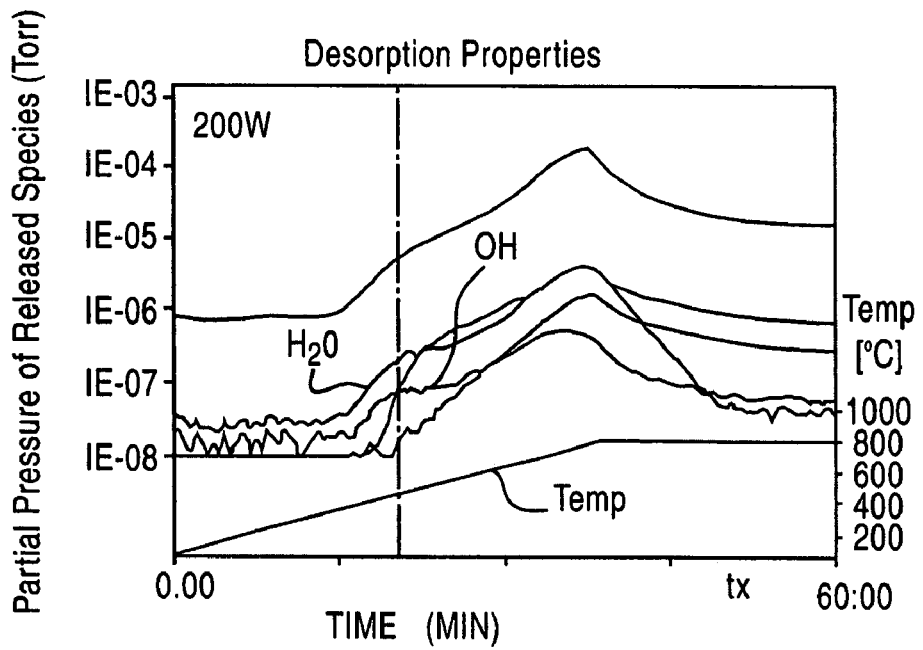
FIG. 4 is another diagram showing the principle of the present invention.

Referring to the drawings, FIG. 3 shows a reference specimen in which the $SiO_2$ film is formed on a Si substrate by a plasma CVD process conducted at a substrate temperature of 480° C. while setting the high-frequency power to a conventional power of 200 W. FIG. 4, on the other hand, shows a case in which the $SiO_2$ film is formed on a Si substrate at a substrate temperature of 400° C. while setting the high-frequency power to 200 W.

In the experiments, the plasma CVD process is conducted in a parallel-plate-type plasma CVD apparatus while supplying $SiH_4$ and $N_2O$ as the gaseous source materials, with a proportion set typically to 1:40. The TDS analysis, on the other hand, was conducted by analyzing the chemical species, particularly $H_2O$ and OH, released from the $SiO_2$ film as a result of the heating by a mass spectroscopy while heating the substrate in the temperature range illustrated in the drawings. In the drawings, it should be noted that the horizontal axis represents the duration in terms of minutes while the vertical axis represents the partial pressure of the released species in terms of Torr.

Referring to FIGS. 3 and 4, it can be seen that a substantial release of $H_2O$ and OH occurs in the $SiO_2$ film deposited under a conventional plasma power of 200 W immediately after the start of the heating. The release of $H_2O$ and OH continues even when the temperature reaches 1000° C.

Figure 5:
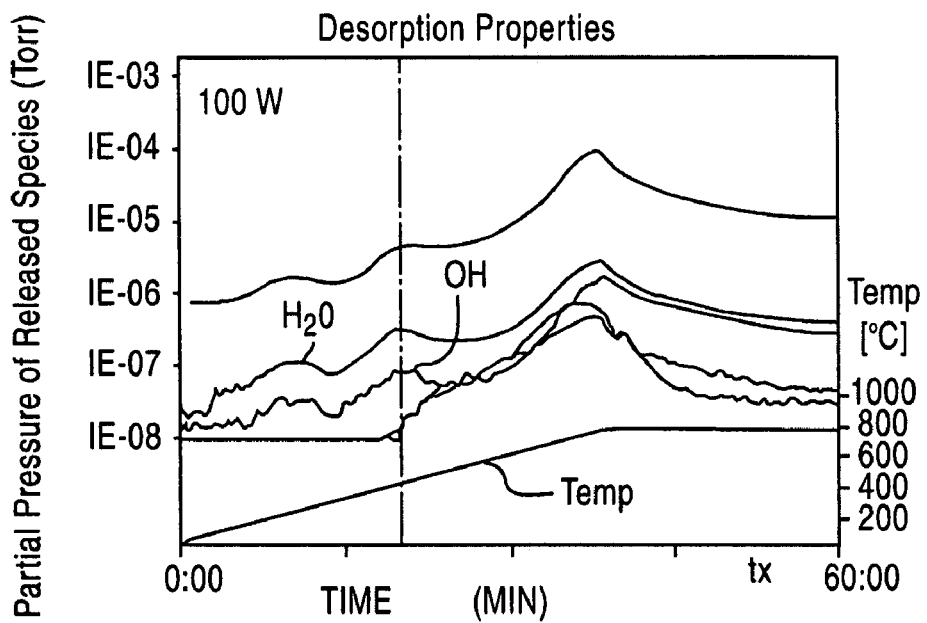
FIG. 5 is a still other diagram showing the principle of the present invention.
Figure 6:
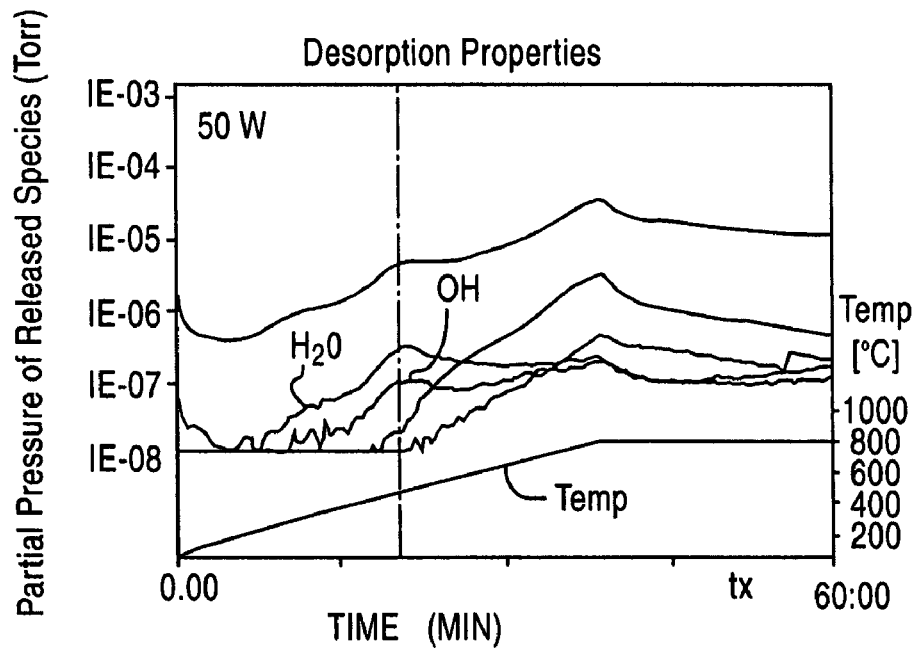
FIG. 6 is a still other diagram showing the principle of the present invention.

FIGS. 5 and 6, on the other hand, show the case in which the high-frequency power is set to 100 W and 50 W respectively when depositing the $SiO_2$ film on a Si substrate by a similar plasma CVD process.

Referring to FIGS. 4 and 6, it is clearly seen that the amount of $H_2O$ and OH incorporated into the $SiO_2$ film is reduced substantially by reducing the high-frequency power used in the plasma CVD process.

Figure 7:
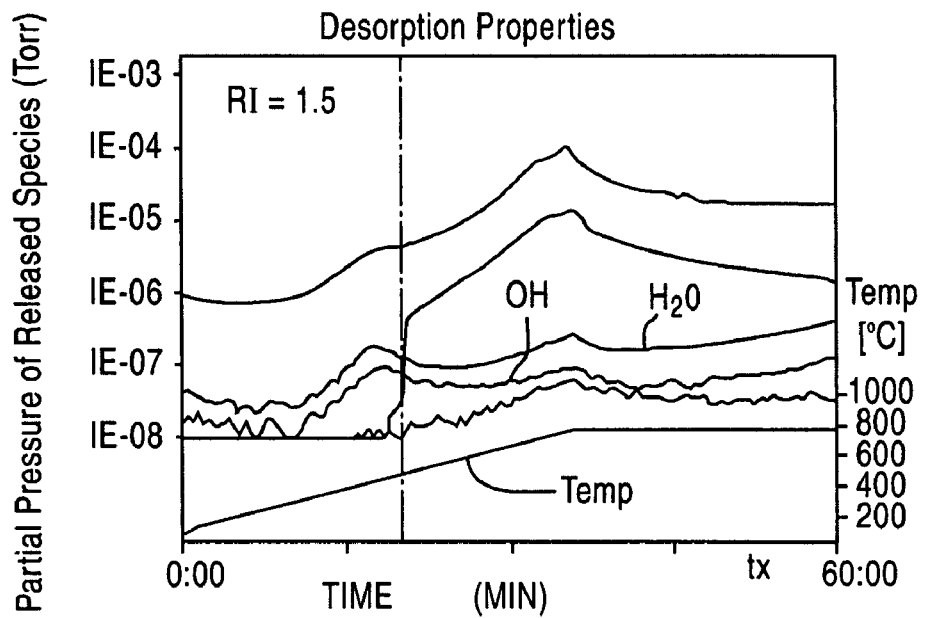
FIG. 7 is a still other diagram showing the principle of the present invention.

Further, FIG. 7 shows the release of $H_2O$ and OH from the $SiO_2$ film deposited on the Si substrate at a substrate temperature of 400° C. and a plasma power of 100 W for a case in which the ratio of $N_2O$ with respect to $SiH_4$ in the gaseous source is set to 10. In this case, the $SiO_2$ film obtained as a result of the plasma CVD process has a refractive index of about 1.5. In contrast, it should be noted that the $SiO_2$ film obtained in FIG. 5 has a refractive index of about 1.47. Further, the $SiO_2$ film of FIG. 3 shows a refractive index of about 1.45.

As can be seen in FIG. 7, the amount of $H_2O$ and OH incorporated into the $SiO_2$ film is reduced further as compared with the case of FIG. 5. It is believed that the foregoing decrease of $H_2O$ and OH content in the $SiO_2$ film observed in the case of FIG. 7 is caused by the increased amount of Si—H bond in the $SiO_2$ film.

Figure 8:
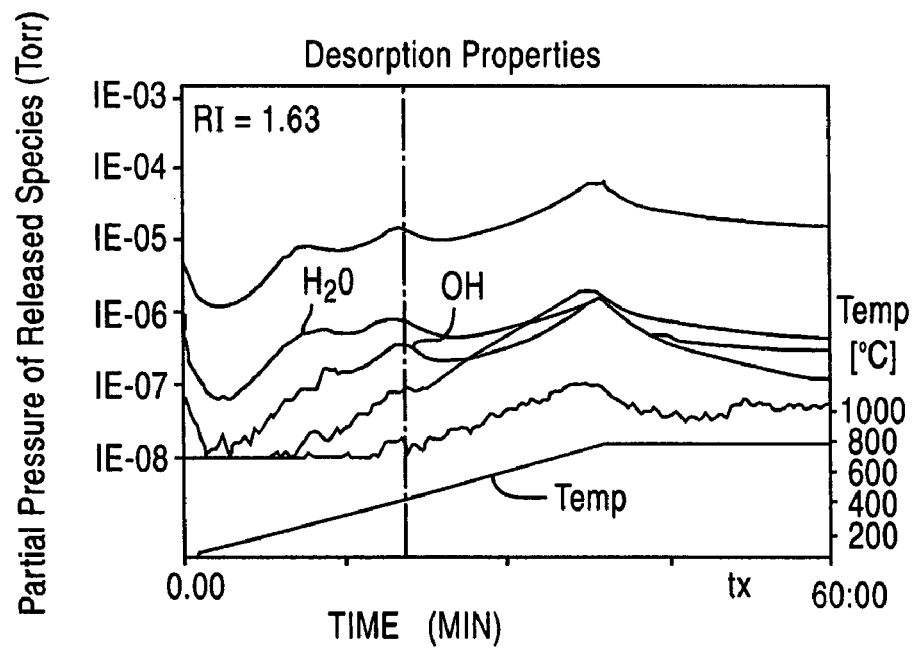
FIG. 8 is a still other diagram showing the principle of the present invention.

When the proportion of $N_2O$ with respect to $SiH_4$ is increased further as in the case of FIG. 8, on the other hand, the amount of $H_2O$ and OH incorporated into the $SiO_2$ film starts to increase again. Thus, it is concluded that the plasma CVD process for depositing an $SiO_2$ film is preferably conducted such that the deposited $SiO_2$ film has a refractive index of higher than about 1.5 but lower than about 1.63.

Figure 9:
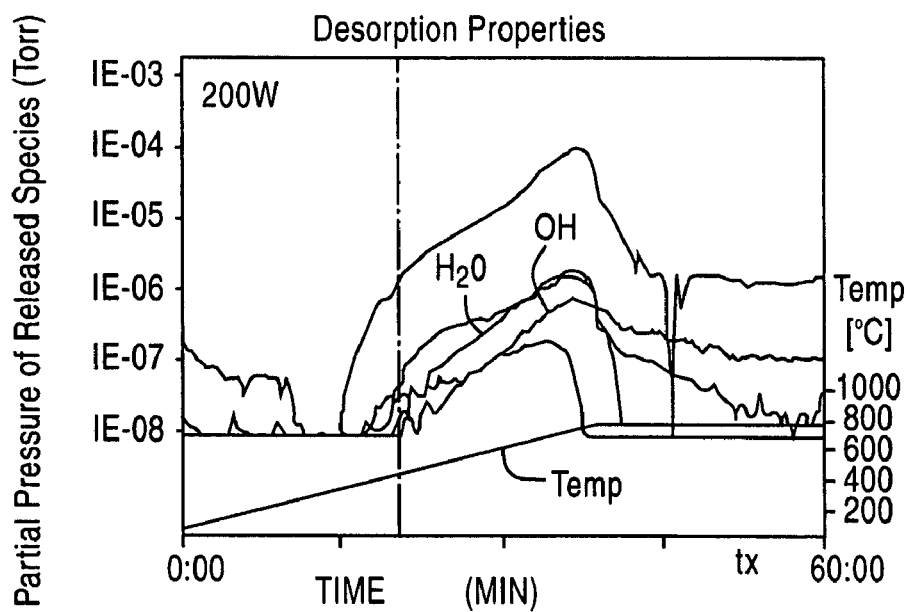
FIG. 9 is a still other diagram showing the principle of the present invention.

FIG. 9 shows a differential in which the result of FIG. 3 is subtracted from the result of FIG. 4. As already explained with reference to FIG. 4, the SO$_2$ film deposed under the plasma power of 200 W contains a large amount of H$_2$O and OH.

Figure 10:
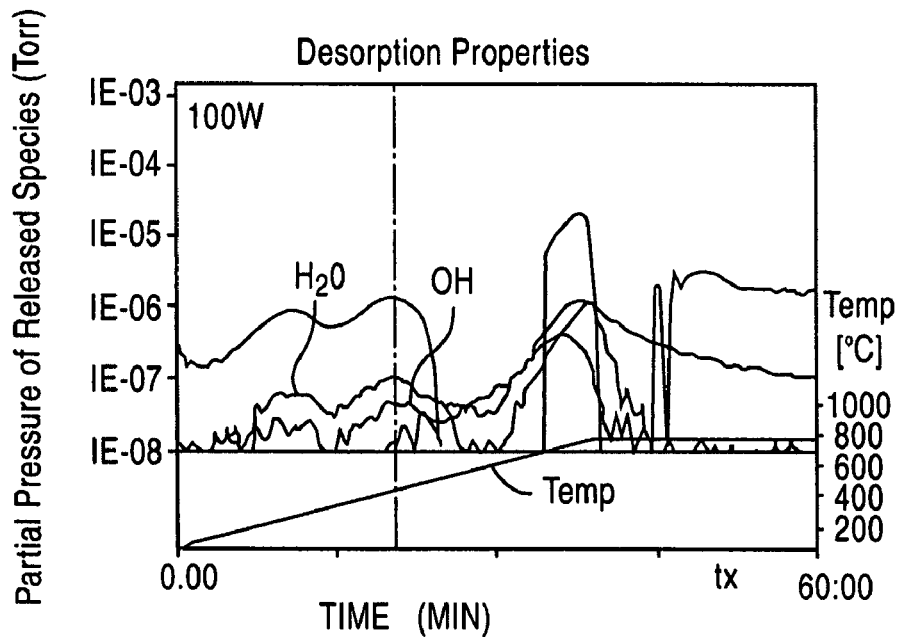
FIG. 10 is a still other diagram showing the principle of the present invention.

FIG. 10 shows, on the other hand, a differential in which the result of FIG. 3 is subtracted from the result of FIG. 5 in which the high-frequency power is set to 100 W. As can be seen clearly from FIG. 10, the amount of H$_2$O and OH released from the SiO$_2$ film deposited under the high-frequency power of 100 W is reduced substantially.

Figure 11:
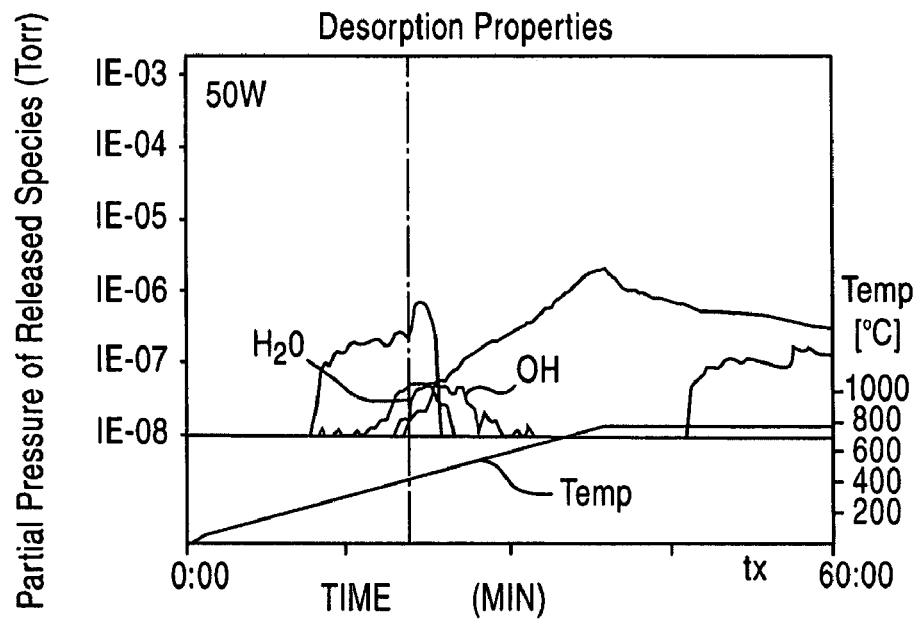
FIG. 11 is a still other diagram showing the principle of the present invention.

Further, FIG. 11 shows a differential in which the result of FIG. 3 is subtracted from the result of FIG. 6 in which the high-frequency power is set to 50 W. As can be seen clearly from FIG. 11, the amount of H$_2$O and OH released from the SiO$_2$ film deposited under the high-frequency power of 50 W is reduced further as compared with the case of FIG. 10.

Figure 12:
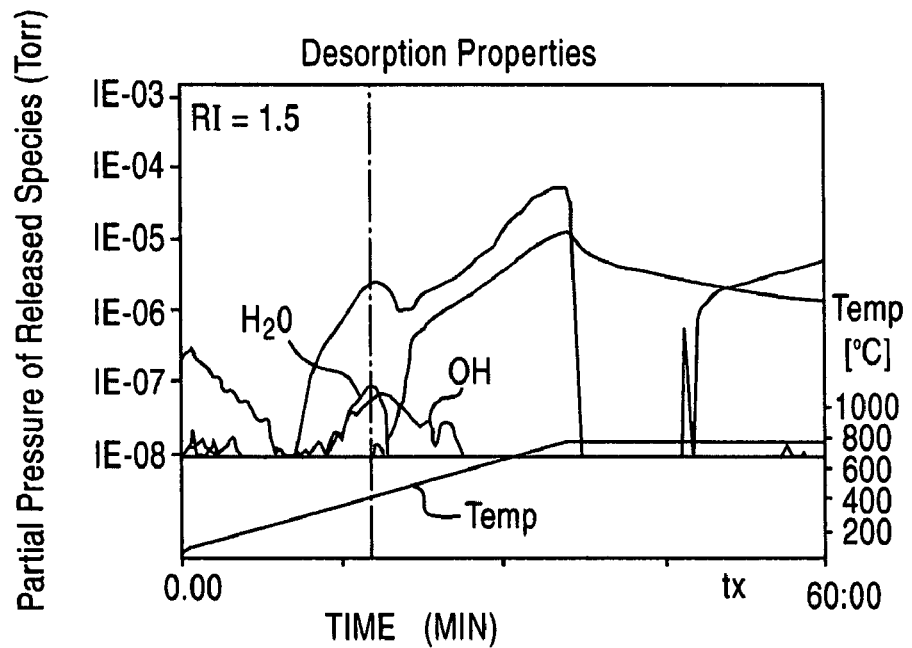
FIG. 12 is a still other diagram showing the principle of the present invention.
Figure 13:
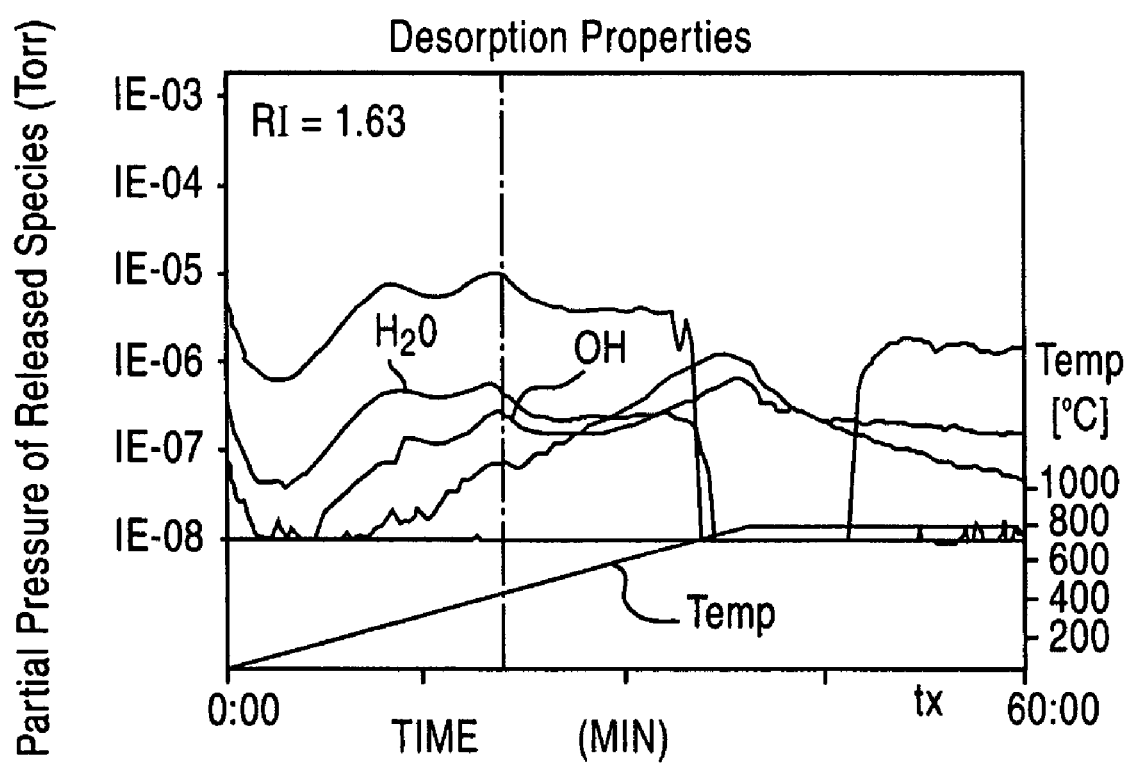
FIG. 13 is a still other diagram showing the principle of the present invention.

Further, FIG. 12 shows a differential in which the result of FIG. 3 is subtracted from the result of FIG. 7 in which the deposited SiO$_2$ film has a refractive index of 1.5. In this case, the amount of release of H$_2$O and OH is reduced further. In contrast, FIG. 13 shows the case in which the result of FIG. 3 is subtracted from the result of FIG. 8 in which the deposited SiO$_2$ film has a refractive index of 1.63. In this case, the amount of H$_2$O and OH incorporated into the SiO$_2$ film starts to increase again.

Figure 2:
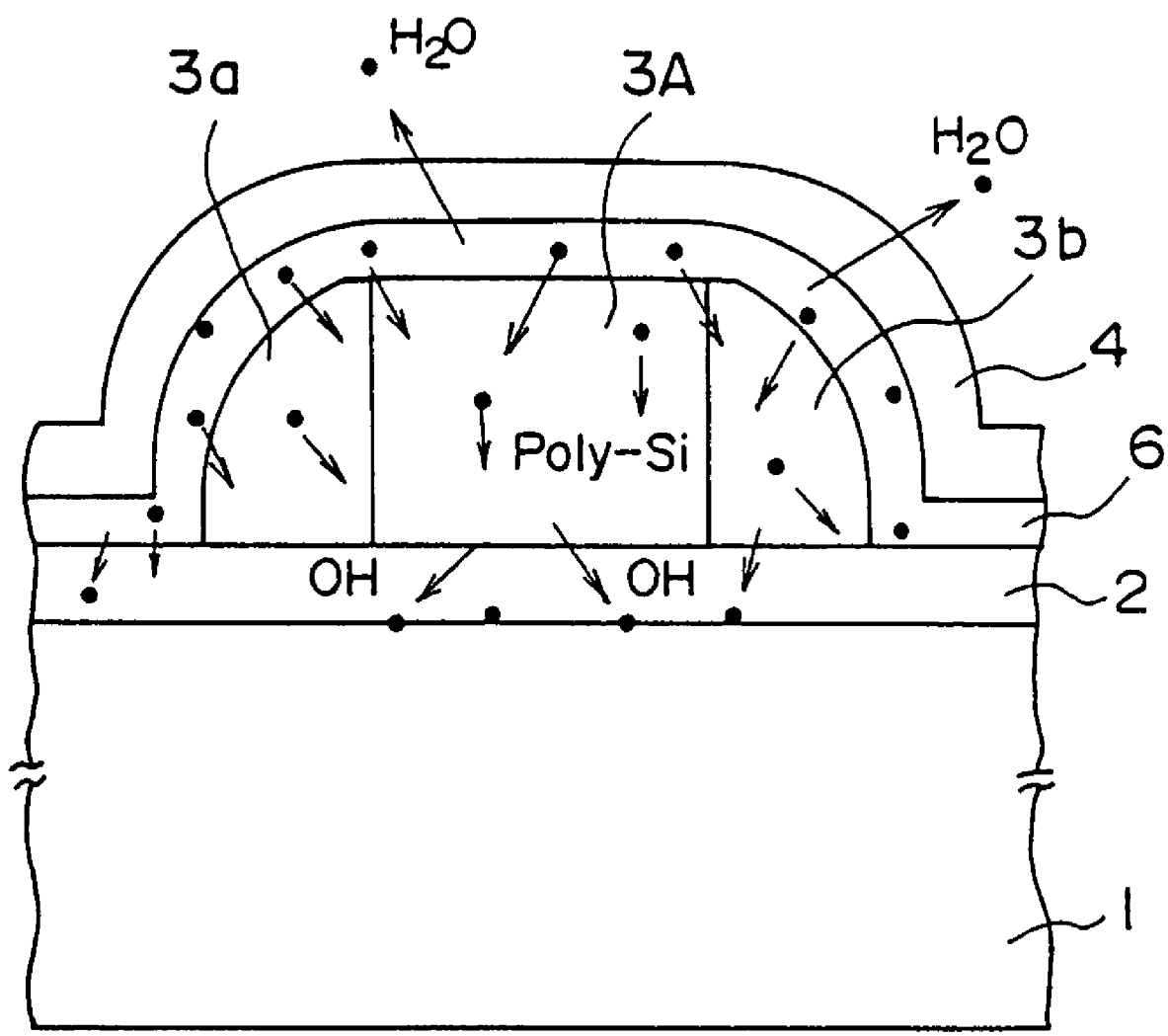
FIG. 2 is a diagram showing the problem of a conventional semiconductor device.

Summarizing above, it is possible to minimize the amount of H$_2$O and OH incorporated into the underlying insulation film 6 of the semiconductor structure of FIG. 2, by setting the high-frequency power, used for a plasma formation, to about 100 W or less when depositing the insulation film 6 by a plasma CVD process, or alternatively by setting the ratio of SiH$_4$ and N$_2$O in a gaseous source material such that the insulation film 6 has a refractive index of about 1.5.

The amount of H$_2$O and OH incorporated into the insulation film 6 of FIG. 2 can be minimized also by incorporating P or B into the film 6. In this case, therefore, the insulation film 6 has a composition of PSG or BPSG.

Figure 14:
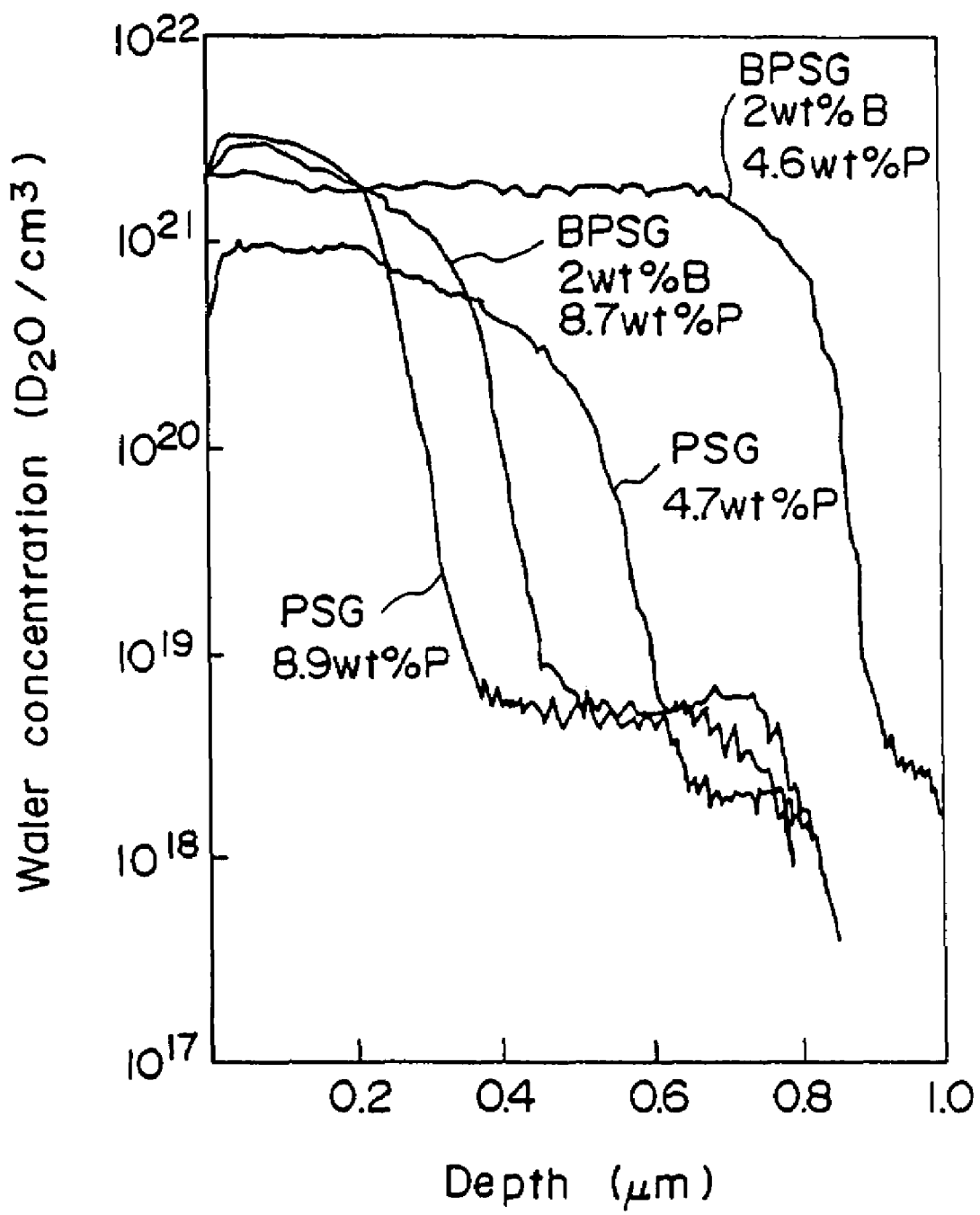
FIG. 14 is a still other diagram showing the principle of the present invention.

FIG. 14 shows the penetration of D$_2$O into a PSG or BPSG film for a case in which the PSG or BPSG film is exposed to a vapor moisture (Pramanik, D., Solid State Technology, September 1995, pp. 69-78).

Referring to FIG. 14, it can be seen that the amount of OH penetrating into a PSG or BPSG film decreases when the P or B content in the film is increased. It is believed that the P or B ions incorporated into the PSG or BPSG film perform a gettering action of H$_2$O therein. When such a PSG or BPSG film is to be used for the insulation film 6 of FIG. 2, it is preferable to set the amount of P to about 6 wt % or less and the amount of B to about 4 wt % or less.

In the structure of FIG. 2, it should be noted that the insulation film 6 may be formed by an ordinary high-temperature CVD process when the substrate temperature is held below about 800° C. In such a case, too, it is desirable to increase the proportion of Si—H bond in the film by increasing the ratio of SiH$_4$ with respect to N$_2$O similarly to the case of the plasma CVD process described before. An SiO$_2$ film containing a large amount of Si—H bond tends to show a high refractive index. Further, it is also possible to apply a thermal annealing process to the oxide film 6 prior to the deposition of the SiN film 4 and cause a releasing of H$_2$O. By using a rapid thermal annealing process, it is possible to minimize the unwanted thermal effect on the silicide layer covering the diffusion region.

FIRST EMBODIMENT

FIGS. 15A-15I show a fabrication process of a MOS transistor according to a first embodiment of the present invention.

Figure 1A:
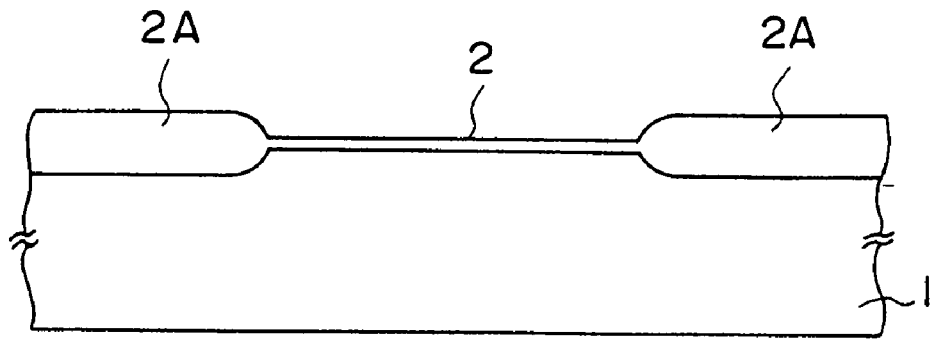
FIGS. 1A-1H are diagrams showing a conventional fabrication process of a semiconductor device that has a self-aligned contact hole.
Figure 1B:
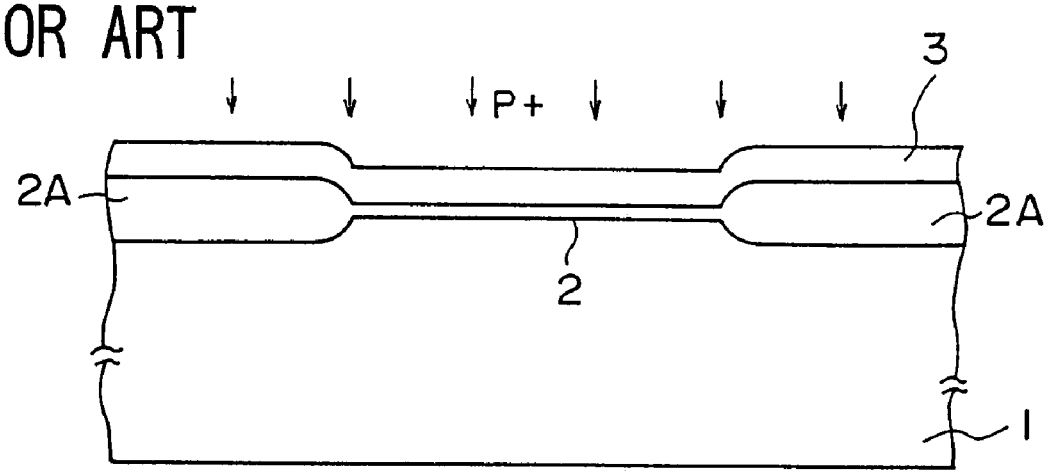
Figure 1C:
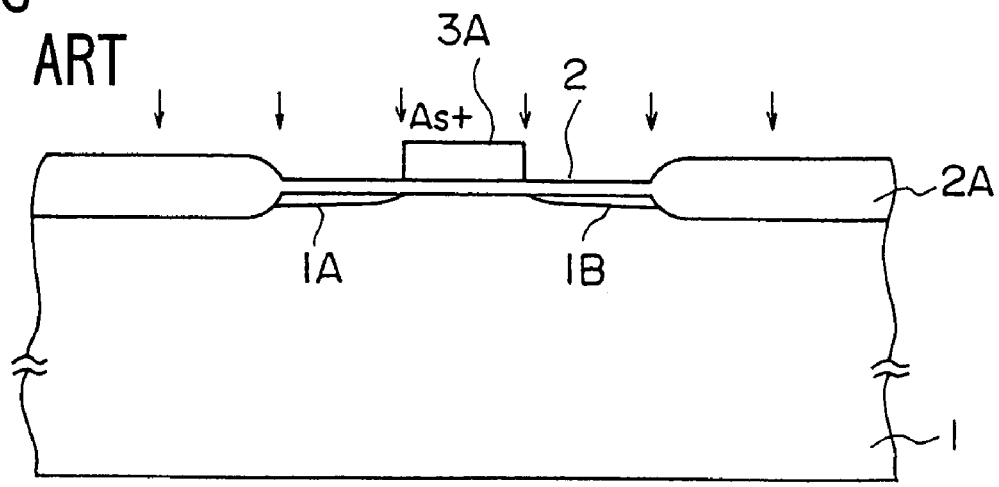
Figure 1D:
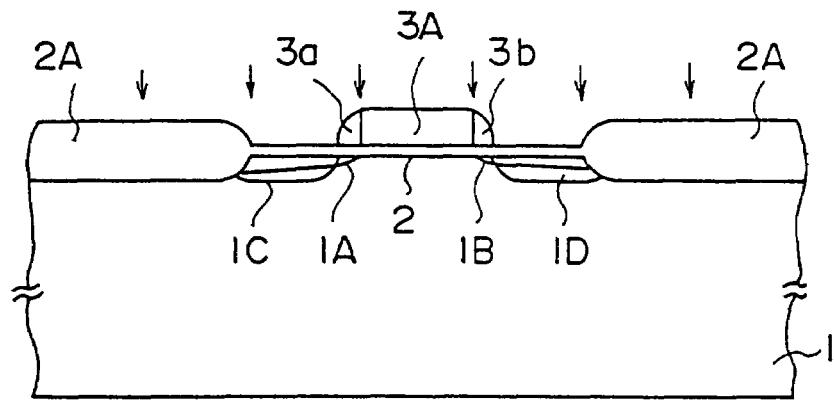
Figure 1E:
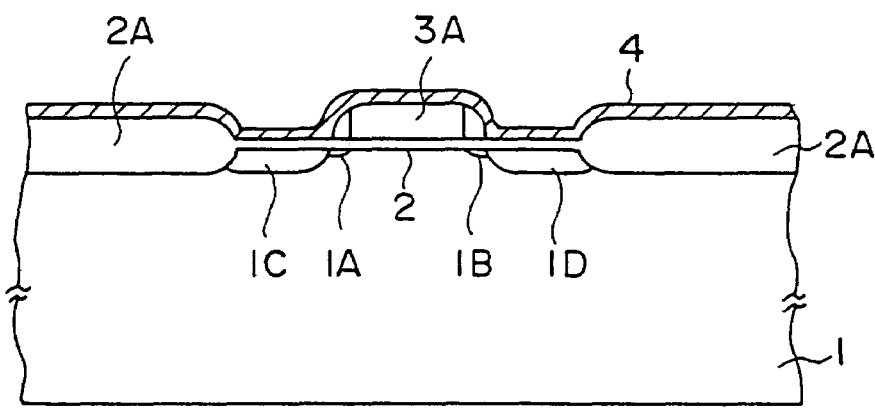
Figure 1F:
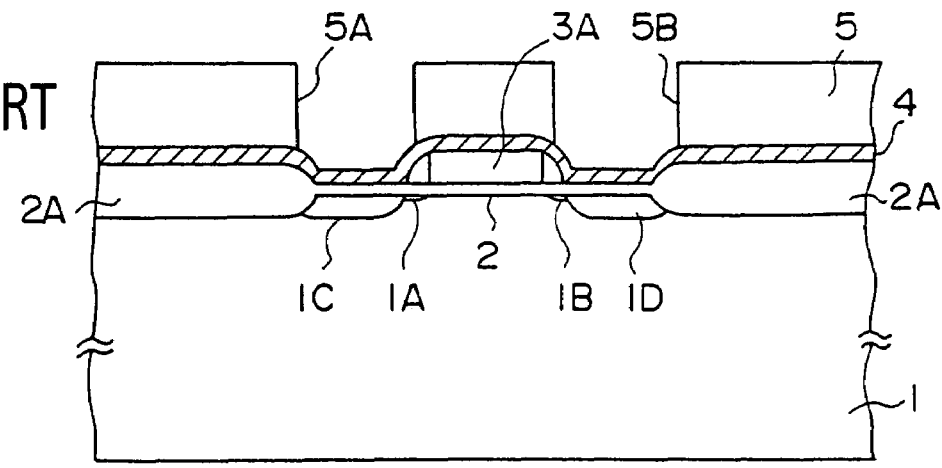
Figure 1G:
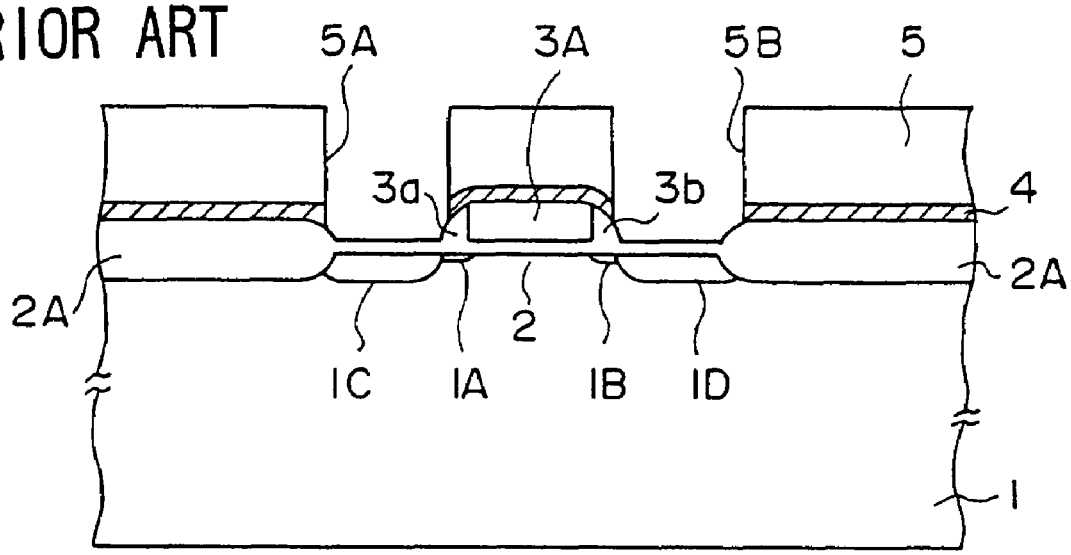
Figure 1H:
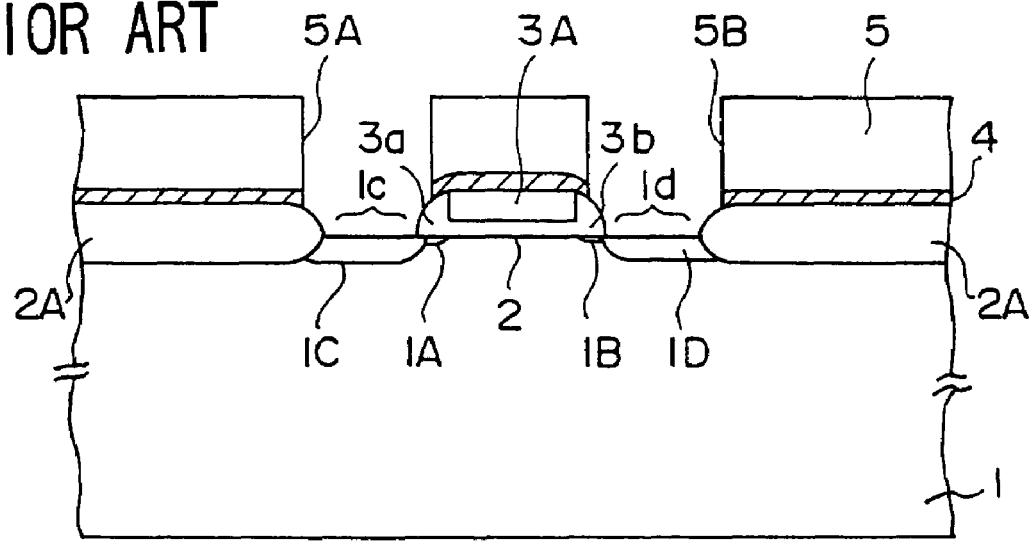
Figure 15A:
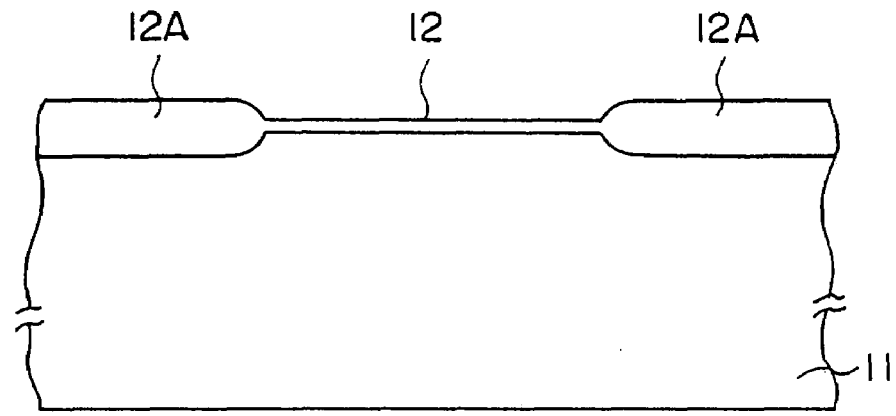
FIGS. 15A-15I are diagrams showing the fabrication process of a semiconductor device according to a first embodiment of the present invention.
Figure 15B:
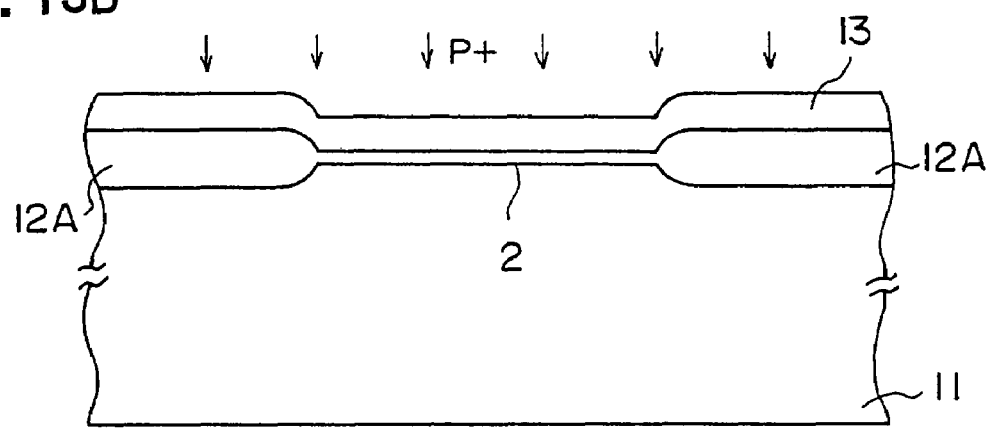
Figure 15C:
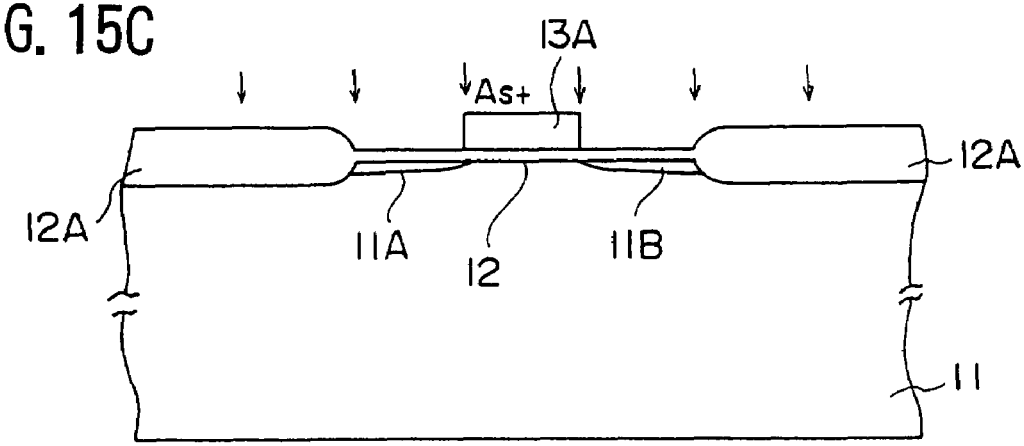

Referring to FIG. 15A, a gate oxide film 12 and a field oxide film 12A are formed on a p-type Si substrate 11 corresponding to the Si substrate 1 of FIG. 1A, and a polysilicon layer 13 is deposited on the structure of FIG. 15A in the step of FIG. 15B. The polysilicon layer 13 thus deposited is then doped to the n$^+$-type by an ion-implantation of P$^+$ ions and patterned in the step of FIG. 15C to form a gate electrode 13A. The ion implantation process of FIG. 15B may be conducted under an acceleration voltage of 20 keV with a dose of 4×10$^{15}$ cm$^{-2}$. In the step of FIG. 15C, an ion implantation process of As$^+$ is further conducted while using the gate electrode 13A as a mask, to form shallow diffusion regions 11 and 11B of the n$^+$-type at both lateral sides of the gate electrode 13A by a self-alignment process. The ion implantation process of FIG. 15C may be conducted under an acceleration voltage of 10 keV with a dose of 3×10$^{14}$ cm$^{-2}$.

Figure 15D:
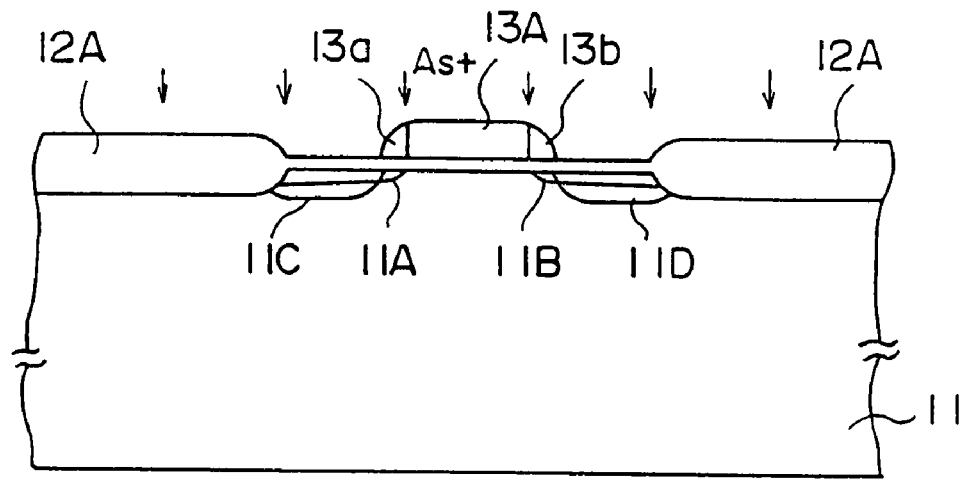

Next, in the step of FIG. 15D, an SiO$_2$ film is deposited on the structure of FIG. 15C uniformly by a CVD process, followed by an anisotropic etching process acting substantially perpendicularly to the surface of the substrate 11 to form side wall oxide films 13a and 13b on both side walls of the gate electrode 13A. Further, additional diffusion regions 11C and 11D are formed so as to partially overlap the diffusion region 11A or 11B by conducting an ion-implantation process of As$^+$ while using the gate electrode 13A and the side-wall oxide films 13a and 13b as a mask, to form a so-called LDD (lightly doped drain) structure. The ion implantation process of FIG. 15D may be conducted under an acceleration voltage to 40 keV with a dose of 2×10$^{15}$ cm$^{-2}$.

Figure 15E:
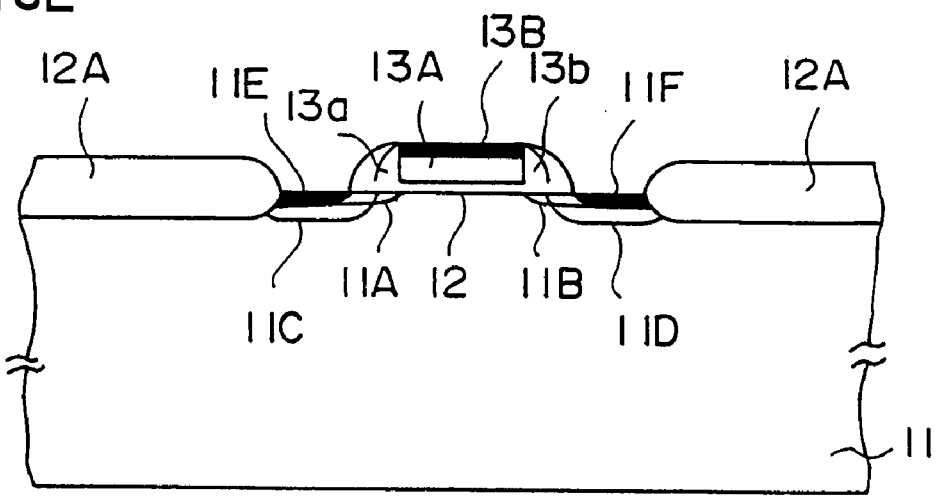

Next, in the step of FIG. 15E, those parts of the gate oxide film 12 covering the diffusion regions 11C and 11D are removed and a Co layer (not shown) is deposited in contact with the exposed diffusion regions and further on the gate electrode 13A. Further, by applying a thermal annealing process conducted at 840° C. for about 30 seconds, the Co layer thus deposited causes a reaction with the exposed surface of the diffusion regions 11C and 11D as well as the gate electrode 13A, and there are formed a silicide film 11E on the surface of the diffusion region 11C as indicated in FIG. 15E. Similarly, a silicide film 11F is formed on the surface of the diffusion region 11D and a silicide film 13B is formed on the gate electrode 13A.

Figure 15F:
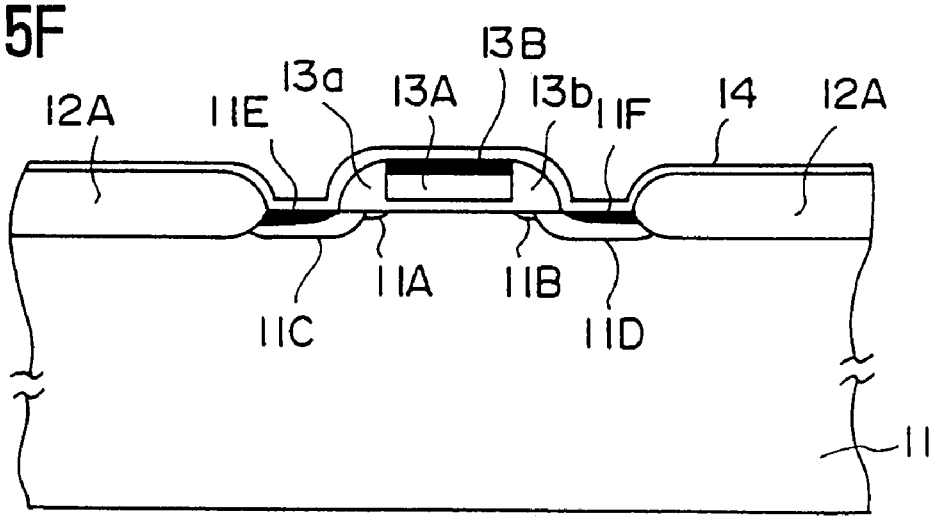

Next, in the step of FIG. 15F, an SiO$_2$ film 14 is deposited on the structure of FIG. 15E by a plasma CVD process with a thickness of about 20 nm. Thereby, the deposition of the SiO$_2$ film 14 is conducted in a parallel-plate-type plasma CVD apparatus under a pressure of 3.0 Torr while setting the substrate temperature to 400° C. and the high-frequency power to 50 W. During the deposition of the SiO$_2$ film 14, SiH$_4$ and N$_2$O are supplied to the reaction chamber of the plasma CVD apparatus as source materials together with an N$_2$ carrier gas with a flow rate of 10 cc/min and 400 cc/min respectively. The flow rate of the N$_2$ carrier gas may be set to 2000 cc/min. The plasma CVD apparatus may have an electrode gap of 300 Mil.

It should be noted that the SiO$_2$ film 14 thus deposited contains H$_2$O with an amount of about 1.1 wt % or less due to the decreased H$_2$O formation in the plasma, wherein the foregoing amount of H$_2$O in the film 14 is substantially smaller than the H$_2$O content of the SiO$_2$ film of FIG. 3 of about 2.4 wt %. Further, it should be noted that the SiO$_2$ film 14 thus formed has a refractive index of about 1.47.

The evaluation of the $H_2O$ content in the $SiO_2$ film 14 is achieved by first calculating the total number of the $H_2O$ molecules (Mm) released from the $SiO_2$ film as a result of the TDS analysis from the time-integral of the partial pressure value (Pxt) of the released $H_2O$ molecules according to the equation $$Mm = C \times ((Pxt)/S) \times 3.35 \times 10^{19},$$

followed by dividing the value Mm by the weight of the $SiO_2$ film 14, which in turn is obtained from the volume of the $SiO_2$ film and the density thereof, wherein the volume of the $SiO_2$ film is obtained from the surface area of the substrate and the film thickness. Further, it should be noted that the parameter C of the foregoing equation stands for the conductance of the orifice used in the TDS analysis while the parameter S stands for the relative sensitivity of the mass spectrometer used in the TDS analysis. Further, the last numerical constant is for the conversion of the obtained pressure integral value to the corresponding molecule number by using an ideal gas model. In the present case, the orifice conductance C has a value of 27.5 l/sec, while the relative sensitivity S has a value of 1 for $H_2O$.

Figure 15G:
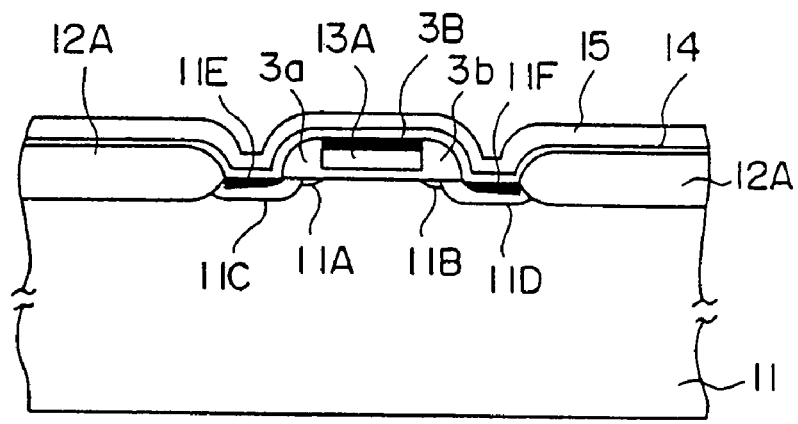
Figure 15H:
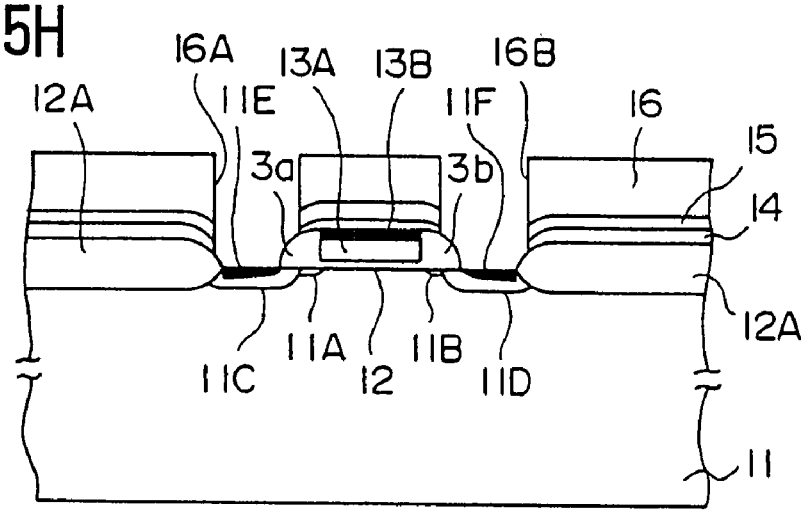

Next, in the step of FIG. 15G, an SiN film 15 is deposited uniformly on the structure of FIG. 15F by a CVD process or a sputtering process, followed by the step of FIG. 15H in which an interlayer insulation film 16 of $SiO_2$, PSG or BPSG is deposited on the foregoing SiN film 15. The interlayer insulation film 16 is further formed with a contact hole 16A in correspondence to the diffusion region 11C by an anisotropic dry etching process. Similarly, a contact hole 16B is formed in the insulation film 16 in correspondence to the diffusion region 11D.

Figure 15I:
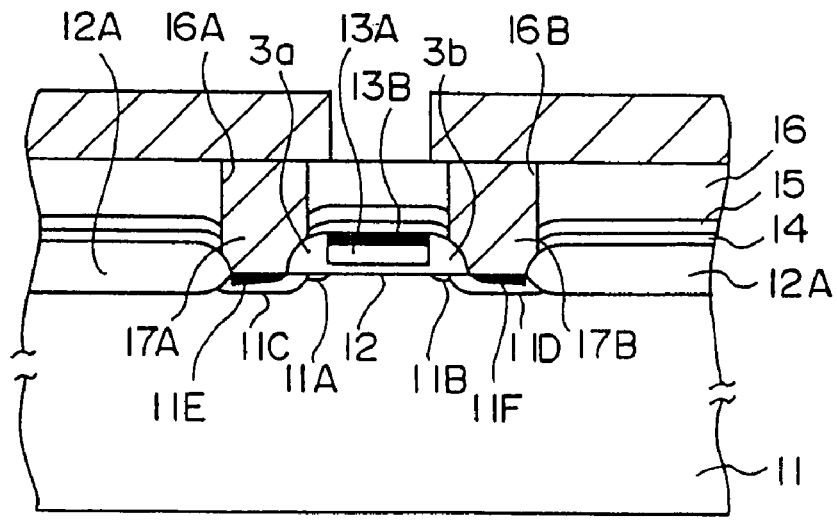

Further, in the step of FIG. 15I, conductive plugs 17A and 17B of polysilicon are provided so as to fill the contact holes 16A and 16B respectively, and an interconnection pattern 17 is provided on the interlayer insulation film 16 in contact with the conductive plug 17A or 17B.

According to the present embodiment, the $H_2O$ formation in the plasma is effectively suppressed by conducting the plasma deposition of the oxide film 14 underneath the SiN film 15 by a reduced plasma power, and the $H_2O$ content incorporated into the $SiO_2$ film 14 is reduced accordingly. As the formation of the oxide film 14 is conducted at a low temperature as a result of use of the plasma CVD process, the problem of Co diffusion and associated short-circuit of the diffusion region, is effectively avoided even when the step of formation of the oxide film 14 is conducted.

It should be noted that the formation of the oxide film 14 may be conducted by setting the high-frequency power to 100 W. In this case, too, the same parallel-plate-type plasma CVD apparatus is used and the deposition is conducted at a substrate temperature of about 400° C. under an internal pressure of 3.0 Torr. During the deposition, $SiH_4$ and $N_2O$ are supplied as the gaseous source respectively with a flow rate of 10 cc/min and a flow rate of 100 cc/min, together with an $N_2$ carrier gas which is supplied to the reaction chamber of the plasma CVD apparatus with a flow rate of 2000 cc/min. The oxide film 14 thus formed has a refractive index of about 1.5.

Further, it is possible to replace the $SiO_2$ film 14 by a PSG or BPSG film that contains P or B. As noted already, P or B shows a gettering action of $H_2O$. When a PSG film is to be used for the insulation film 14, it is preferable to set the P content in the PSG film 14 to be about 6 wt % or less. When a BPSG film is to be used for the insulation film 14, on the other hand, it is preferable to set the B content in the film 14 to be about 4 wt % or less.

Further, it should be noted that the foregoing oxide film 14 may be formed also by an ordinary high-temperature CVD process. In this case, it is preferable to set the substrate temperature to about 825° C. or less for minimizing the diffusion of metal elements from the silicide film and set the ratio of $N_2O$ with respect to $SiH_4$ to be less than about 5 so as to maximize the Si—H bond formation in the film. Further, it is also possible to cause a release of $H_2O$ from the oxide film 14 by applying a thermal annealing process to the film 14 at a temperature of about 825° C. prior to the deposition of the SiN film 15.

As the deposition of the oxide film 14 and the deposition of the SiN film 15 are conducted in the same deposition apparatus continuously, the chance that the deposited oxide film 14 contacts the atmospheric environment and absorbs the moisture in the atmosphere is positively eliminated.

SECOND EMBODIMENT

Figure 16A:
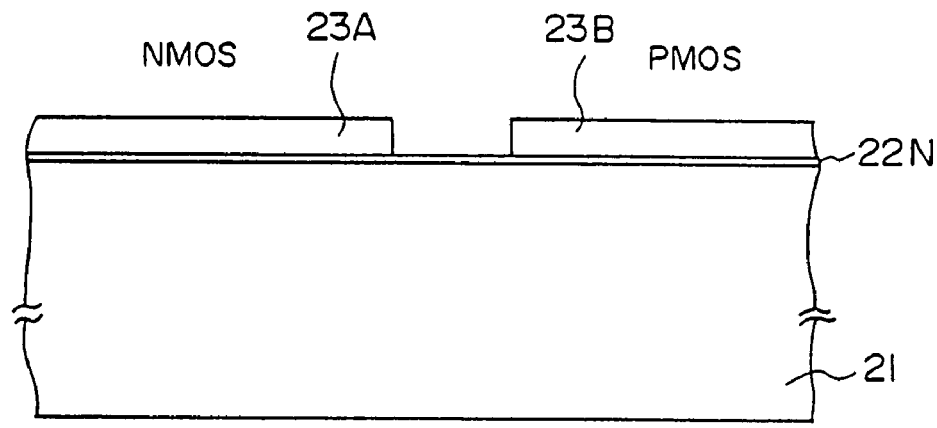
FIGS. 16A-16O are diagrams showing the fabrication process of a semiconductor device according to a second embodiment of the present invention.
Figure 16B:
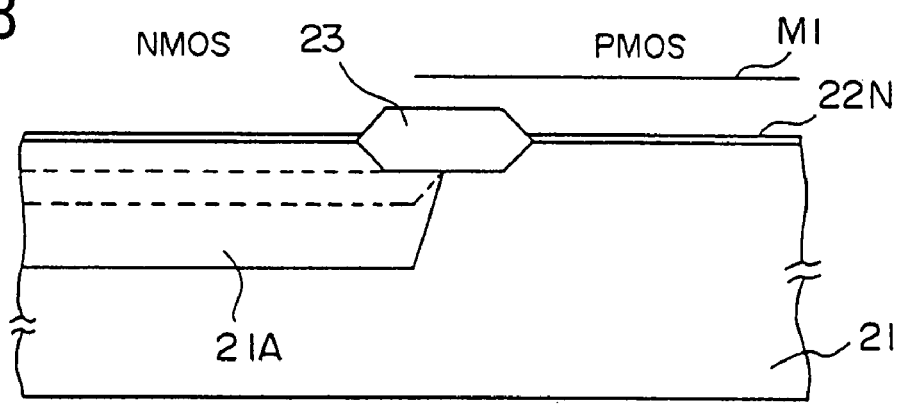
Figure 16C:
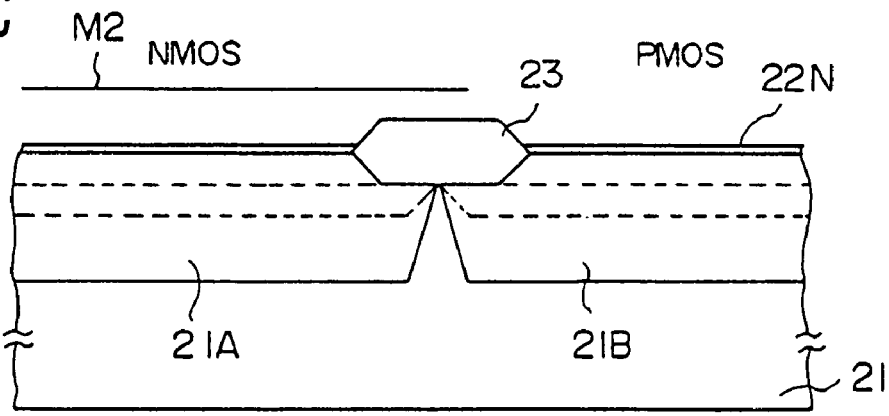
Figure 16D:
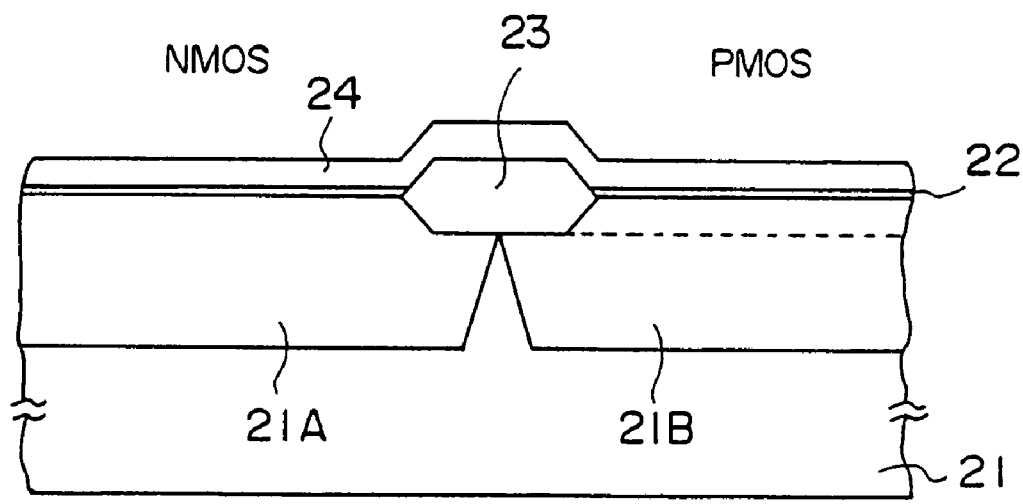
Figure 16E:
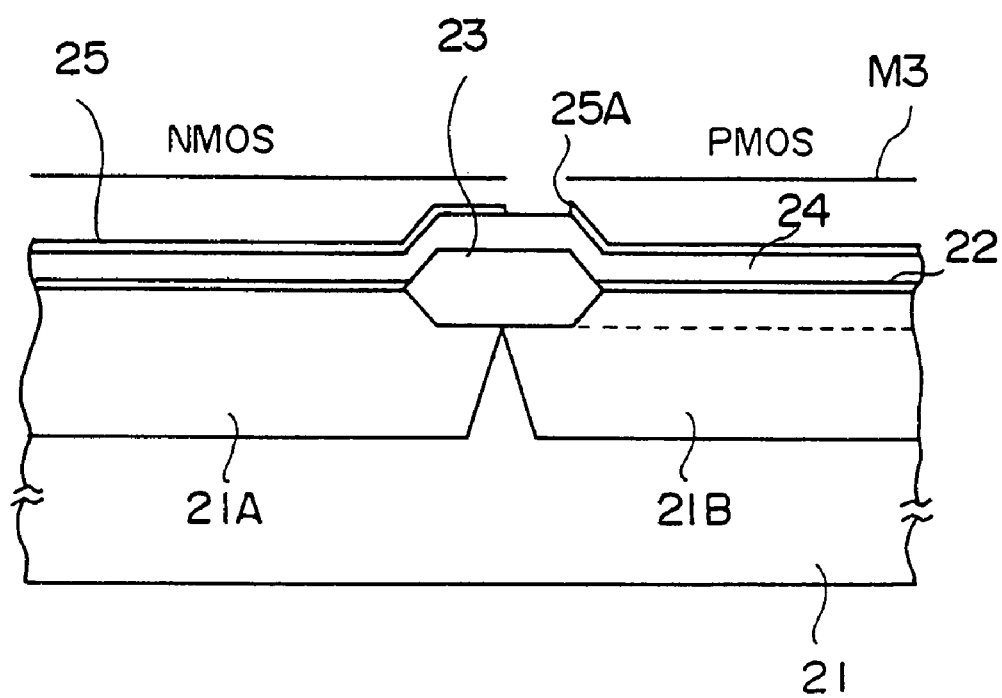
Figure 16F:
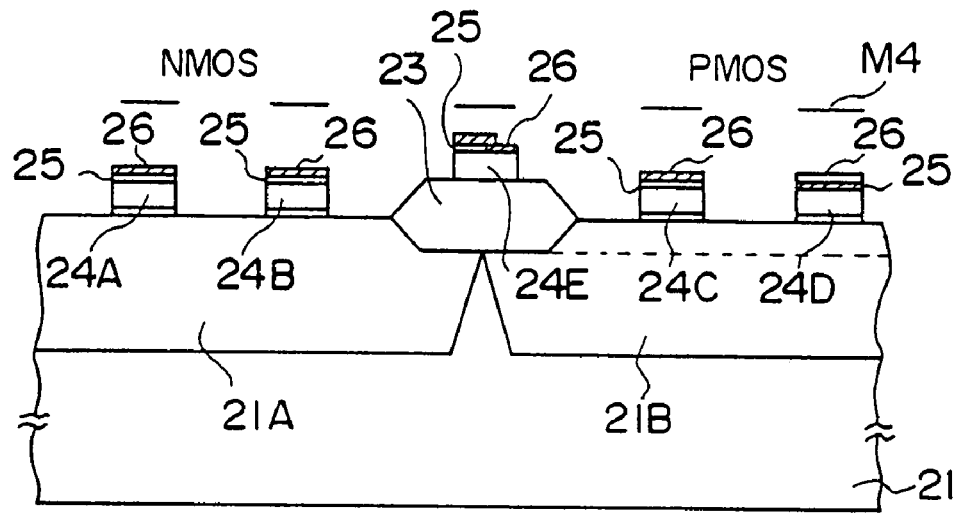
Figure 16G:
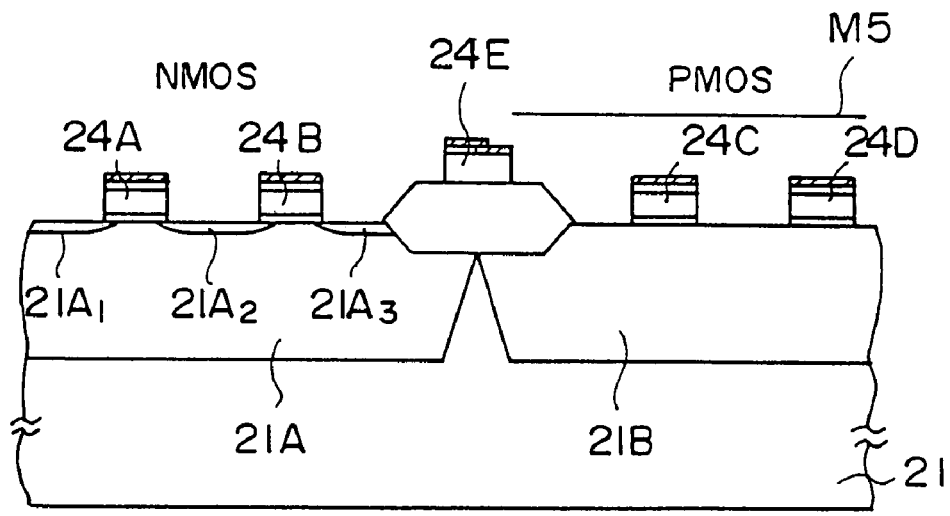
Figure 16H:
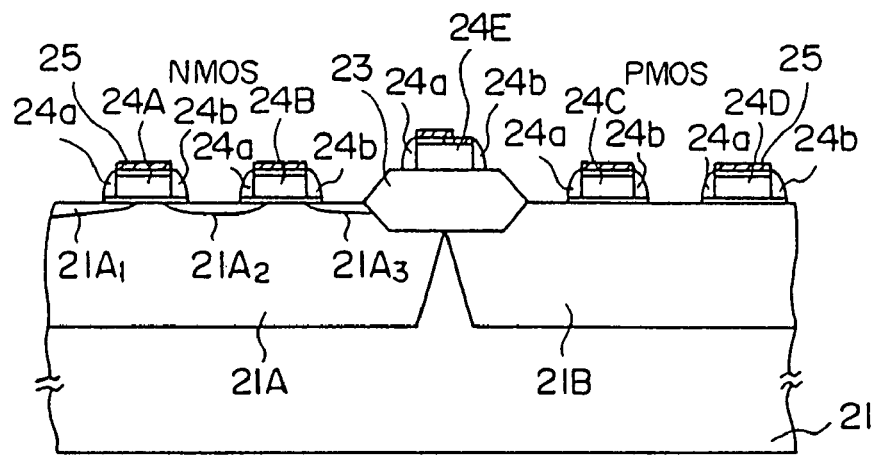
Figure 16I:
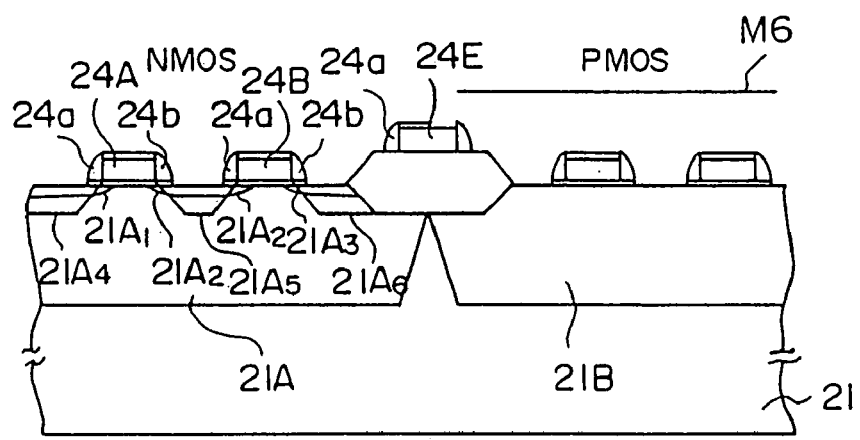
Figure 16J:
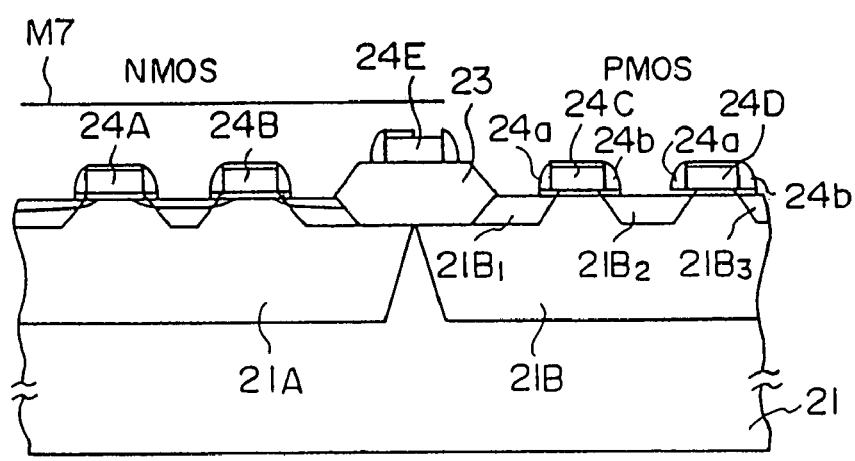
Figure 16K:
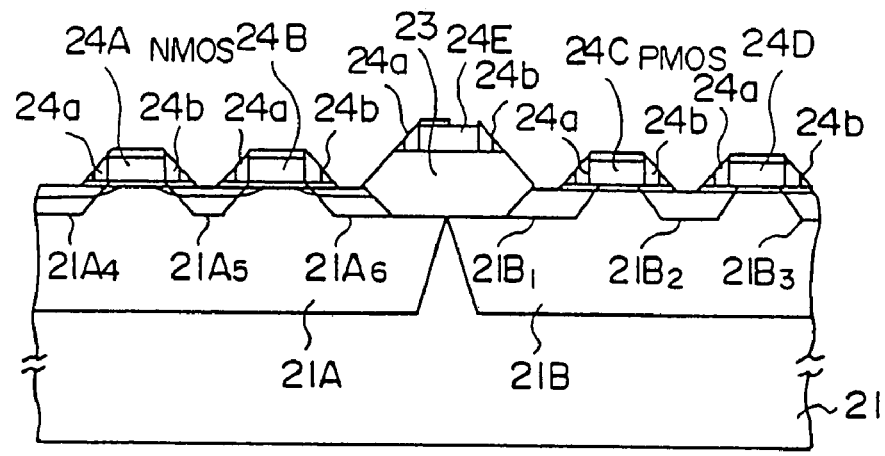
Figure 16L:
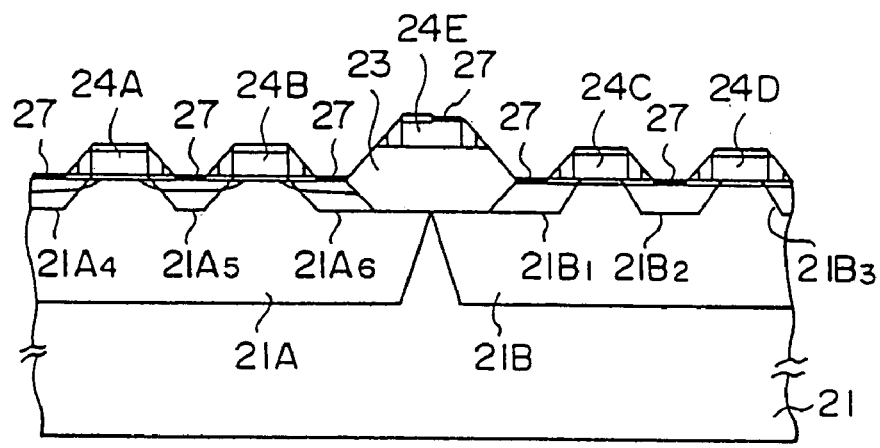
Figure 16M:
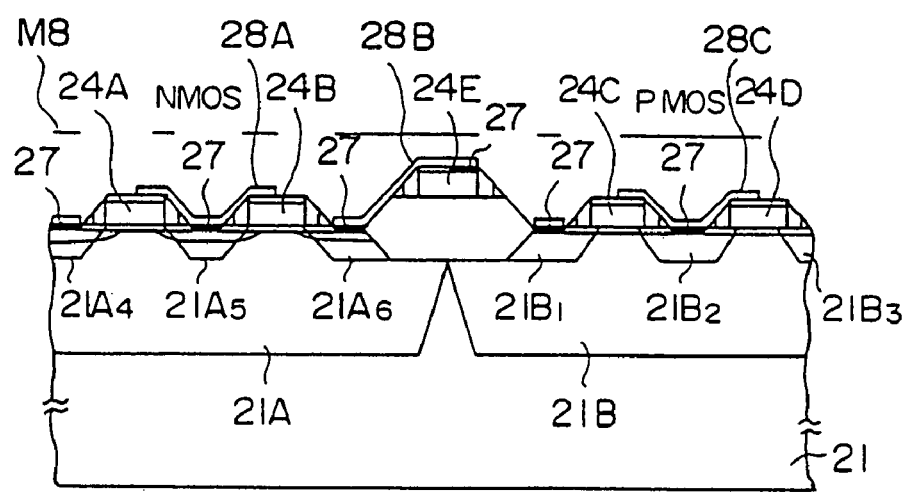
Figure 16N:
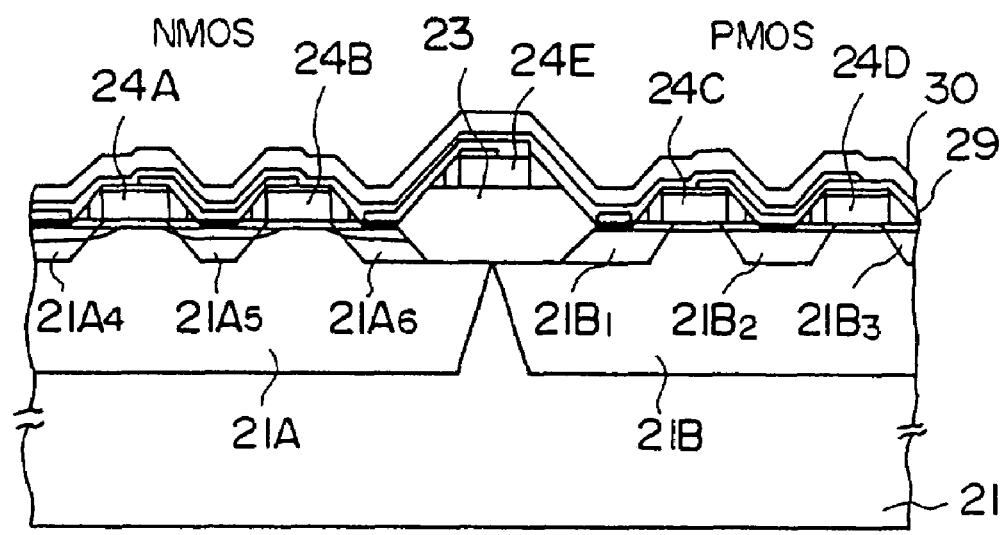
Figure 16O:
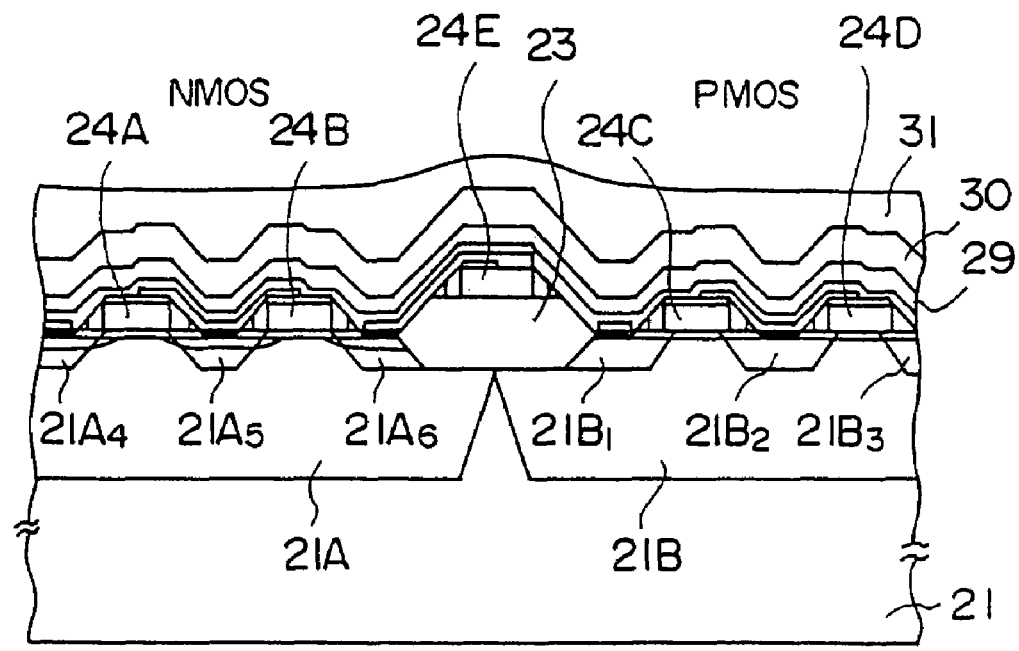

FIGS. 16A-16O show a fabrication process of a semiconductor device according to a second embodiment of the present invention.

Referring to FIG. 16A, a Si substrate 21 of the p-type or n-type is covered by a native oxide film 22N, and an SiN mask 23A as well a an SiN mask 23B are provided on the substrate 21 such that the SiN mask 23A protects an NMOS region on which an NMOS transistor is to be formed. Similarly, the SiN mask 23B protects a PMOS region on which a PMOS transistor is to be formed. The mask 23A and 23B are separated and there is formed a gap between the region for the NMOS transistor and the region for the PMOS transistor. The gap exposes the native oxide film 22N formed on the substrate 21.

Next, in the step of FIG. 16B, the structure of FIG. 16A is subjected to a wet oxidation process to form a field oxide film 23 in correspondence to the foregoing gap typically with a thickness of about 250 nm. Further, a mask M1 is provided in the step of FIG. 16B so as to cover the PMOS region, and an ion implantation of $B^+$ is conducted into the substrate 21 with an acceleration voltage of 300 keV and a dose of $3 \times 10^{13}$ $cm^{-2}$. As a result of the ion implantation process, a p-type well 21A is formed in the substrate 21 in a first side of the field oxide film 23 in correspondence to the NMOS region.

Next, in the step of FIG. 16C, the NMOS region is covered by a mask M2 and an ion implantation of $P^+$ is conducted into the substrate 21 with an acceleration voltage of 600 keV and a dose of $3 \times 10^3$ $cm^{-2}$. As a result of the ion implantation process, an n-type well 21B is formed in the substrate 21 in a second, opposite side of the field oxide film 23 in correspondence to the PMOS region.

Next, in the step of FIG. 16D, the native oxide film 22N is removed by an etching process and a thermal oxide film 22 is formed on the surface of the substrate 21 by a thermal oxidation process with a thickness of about 5.5 nm. Further, a polysilicon film 24 is formed in the step of FIG. 16D on the structure thus formed with a thickness of about 180 nm.

Next, in the step of FIG. 16E, an oxide film 25 is formed on the structure of FIG. 16D by an ordinary high-temperature CVD process typically with a thickness of 80 nm, and an opening 25A is formed in the oxide film 25 thus formed in correspondence to a part thereof covering the field oxide film 23 by using a mask M3.

Next, in the step of FIG. 16F, an SiN film 26 is formed on the oxide film 25 by a plasma CVD process with a thickness of typically about 26 nm. The SiN film 26 thus formed is patterned according to a desired gate pattern by using a mask M4, and the oxide film 25 and the polysilicon film 24 underneath the SiN film 26 are patterned while using the SiN pattern 26 thus obtained as a mask. Thereby, gate electrodes 24A-24E are formed. It should be noted that the gate electrodes 24A and 24B thus formed are located on the well 21A, while the gate electrodes 24C and 24D are formed on the well 21B. Further, the gate electrode 24E is formed on the field oxide film 23. Further, the oxide films 22 exposed at both sides of the foregoing gate electrodes are removed selectively.

Next, in the step of FIG. 16G, the PMOS region is protected by a mask M5, and an ion implantation of As⁺ is conducted into the gate electrodes 24A and 24B under an acceleration voltage of 10 keV with a dose of $3\times10^{14}$ cm$^{-2}$. As a result of the foregoing ion implantation process of As⁺, diffusion regions $21A_1$, $21A_2$ and $21A_3$ are formed in the well 21A adjacent to the gate electrodes 24A and 24B.

Next, in the step of FIG. 16H, each of the gate electrodes 24A-24E is formed with a pair of side wall oxide films 24a and 24b by a well known process that includes a CVD deposition of an oxide film and an etch-back process. Further, the SiN film 25 is removed and the step of FIG. 16I is conducted, in which an ion implantation of As⁺ is conducted into the well 21A while using the gate electrodes 24A and 24B and further the side wall oxide films 24a and 24b as a mask, to form a diffusion region $21A_4$ in superposition to the diffusion region $21A_1$ and a diffusion region $21A_5$ in superposition to the diffusion region $21A_2$. Thereby, an LDD structure is formed in the well 21A in the step of FIG. 16I. It should be noted that the ion implantation process of As⁺ of FIG. 16I is conducted under an acceleration voltage of 40 keV with a dose of $2\times10^{15}$ cm$^{-2}$, while protecting the PMOS region by a mask M6.

Next, in the step of FIG. 16J, the NMOS region is protected by a mask M7, and an ion implantation process of B⁺ is conducted into the well 21B while using the gate electrodes 24C and 24D and further the side wall oxide films 24a and 24b as a mask. The ion implantation of B⁺ is typically conducted under an acceleration voltage of 7 keV with a dose of $2\times10^{15}$ cm$^{-2}$, and diffusion regions $21B_1$, $21B_2$ and $21B_3$ are formed in the well 21B as a result.

Further, in the step of FIG. 16K, the side wall oxide films 24a and 24b on the gate electrodes 24A-24E are grown laterally by depositing a CVD oxide film further thereon, followed by an etch-back process. In this process, the diffusion regions $21A_4$-$21A_6$ as well as the diffusion regions $21B_1$-$21B_6$ are exposed on the Si substrate 21, and a step of FIG. 16L is conducted in which a Co film (not shown) is deposited by a sputtering process. It should be noted that the diffusion regions $21A_4$-$21A_6$ include therein diffusion regions $21A_1$-$21A_3$ respectively.

The structure thus obtained is then subjected to a thermal annealing process conducted at 550° C. for 30 minutes, to form a self-aligned silicide (CoSi$_2$) layer 27 on the exposed surface of the diffusion region. After the formation of the silicide layer 27, the remaining Co layer is removed by an etching process, and the overall structure is subjected to a thermal annealing process conducted at 825° C. for 20 seconds. It should be noted that the silicide layer 27 is formed also on the exposed part of the electrode 24E corresponding to the opening 25A. See FIG. 16E.

Next, in the step of FIG. 16M, a TiN layer is deposited on the structure of FIG. 16L by a reactive sputtering process typically with a thickness of about 20 nm, and the TiN layer thus deposited is patterned subsequently while using a mask M8 to form local interconnection patterns 28A, 28B and 28C in electrical contact with the foregoing silicide layer 27. In the illustrated example, the diffusion regions $21A_3$ and $21A_6$ are formed in electrical connection with the electrode 24E via the foregoing local interconnection pattern 28B and the silicide layer 27, and the semiconductor device forms an SRAM.

Next, in the step of FIG. 16N, an oxide (SiO$_2$) film 29 is formed on the structure of FIG. 16M by a plasma CVD process similarly to the oxide film 14 of the previous embodiment, with a thickness of 20 nm.

Thus, the deposition of the oxide film 29 is conducted in a parallel-plate-type plasma CVD apparatus at a substrate temperature of 400° C. while setting the high-frequency power to 50 W. During the deposition of the oxide film 29, the internal pressure of the reaction chamber of the plasma CVD apparatus is set to 3.0 Torr and SiH$_4$ and N$_2$O are supplied as the gaseous source together with an N$_2$ carrier gas with respective flow rates of 10 cc/min and 400 cc/min. The flow rate of the N$_2$ carrier gas is set to about 2000 cc/min. Similarly as before, the gap between the electrodes of the plasma CVD apparatus is set to 300 Mil. As the formation of H$_2$O in the plasma is suppressed in the plasma CVD process conducted under the foregoing conduction, the SiO$_2$ film 29 thus obtained typically has an H$_2$O content of 1.1 wt % or less and a refractive index of about 1.47.

After the foregoing formation of the oxide film 29, an SiN film 30 is formed on the oxide film 29 by a plasma CVD process as indicated in FIG. 16N with a thickness of about 70 nm. Further, an interlayer insulation film 31 of SOG or the like is deposited on the structure of FIG. 16N in the step of FIG. 16O.

It should be noted that the formation of the oxide film 29 may be conducted by setting the high-frequency power to 100 W. In this case, too, the same parallel-plate-type plasma CVD apparatus is used and the deposition is conducted at a substrate temperature of about 400° C. under an internal pressure of 3.0 Torr. During the deposition, SiH$_4$ and N$_2$O are supplied as the gaseous source respectively with a flow rate of 10 cc/min and a flow rate of 100 cc/min, together with an N$_2$ carrier gas which is supplied to the reaction chamber of the plasma CVD apparatus with a flow rate of 2000 cc/min. The oxide film 29 thus formed has a refractive index of about 1.5.

Further, it is possible to replace the SiO$_2$ film 29 by a PSG or BPSG film that contains P or B. As noted already, P or B shows a gettering action of H$_2$O. When a PSG film is to be used for the insulation film 29, it is preferable to set the P content in the PSG film 29 to be about 6 wt % or less. When a BPSG film is to be used for the insulation film 29, on the other hand, it is preferable to set the B content in the film 29 to be about 4 wt % or less.

Further, it should be noted that the foregoing oxide film 29 may be formed also by an ordinary high-temperature CVD process. In this case, it is preferable to set the substrate temperature to about 825° C. or less for minimizing the diffusion of metal elements from the silicide film and set the ratio of N$_2$O with respect to SiH$_4$ to be less than about 5 so as to maximize the Si—H bond formation in the film. Further, it is also possible to cause a release of H$_2$O from the oxide film 29 by applying a thermal annealing process to the film 29 at a temperature of about 825° C. prior to the deposition of the SiN film 30.

As the deposition of the oxide film 29 and the deposition of the SiN film 30 are conducted in the same deposition apparatus continuously, the chance that the deposited oxide film 29 contacts the atmospheric environment and absorbs the moisture in the atmosphere is positively eliminated.

Further, the present invention is not limited to the embodiments described heretofore, but various variations and modifications may be made without departing from the scope of the present invention.

What is claimed is:

1. A method of fabricating a semiconductor device, comprising the steps of:
   forming a gate electrode on a substrate;
   forming a diffusion region in said substrate adjacent to said gate electrode;
   forming a side wall oxide film on a side wall of said gate electrode;
   forming an interlayer insulation film on said substrate such that said interlayer insulation film covers said gate electrode and further said side wall oxide film; and
   forming a self-aligned opening in said interlayer insulation film such that said self-aligned opening exposes said diffusion region;
   said step of forming said self-aligned opening comprising the steps of:
   forming a first insulation film of an oxide such that said first insulation film covers said side wall oxide film and said diffusion region;
   depositing a second insulation film having a composition different from a composition of said first insulation film, on said first insulation film;
   forming said interlayer insulation film on said second insulation film;
   forming a contact hole in said interlayer insulation film in correspondence to said diffusion region by an etching process while using said second insulation film as an etching stopper;
   removing said second insulation film exposed at a bottom of said contact hole by an etching process while using said first insulation film as an etching stopper; and
   removing said first insulation film exposed at a bottom of said contact hole selectively with respect to said diffusion region;
   wherein said step of forming said first insulation film is conducted by a plasma CVD process, with a high-frequency power set smaller than a high-frequency power in which said first insulation film contains $H_2O$ with an amount of about 2.4 wt %; and wherein said high-power frequency is smaller than 200 W.

2. A method as claimed in claim 1, wherein said high-frequency power is set smaller than a high-frequency power in which said first insulation film contains $H_2O$ with an about of about 1.1 wt % or less.

3. A method as claimed in claim 1, wherein said high-frequency power is set smaller than about 100 W.

4. A method as claimed in claim 1, wherein said high-frequency power is set between about 50 W and about 100 W.

5. A method as claimed in claim 1, wherein said first insulation film has a refractive index of about 1.5.

6. A method as claimed in claim 1, wherein said plasma CVD process is conducted while using $SiH_4$ and $N_2O$ as source materials, with a proportion of $N_2O$ with respect to $SiH_4$ set to be about 10 or less.

7. A method as claimed in claim 1, further including a step, after said step of forming said first insulation film and before said step of forming said second insulation film, of annealing said first insulation film.

8. A method as claimed in claim 7, wherein said annealing step is conducted by a rapid heating process.

9. A method as claimed in claim 1, wherein said step of forming said first insulation film and said step of forming said second insulation film are conducted in a common reaction vessel, without a step of taking out said substrate outside said reaction vessel.

10. A method as claimed in claim 1, wherein said step of forming said diffusion region includes a step of forming a silicide on a surface of said diffusion region, and wherein said step of forming said silicide is conducted before said step of forming said first insulation film.

11. A method as claimed in claim 1, further comprising a step, before said step of forming said first insulation layer, of forming a conductor pattern in contact with said diffusion region.

12. A method of fabricating a semiconductor device, comprising the steps of:
    forming a refractory metal layer on a diffusion region in a semiconductor substrate;
    forming a self-aligned silicide layer on said refractory metal layer by applying a heat-treatment process;
    forming an insulation film on a surface of said silicide layer by conducting a plasma CVD process while using a source gas containing $SiH_4$ and $N_2O$ with a ratio of $N_2O$ with respect to $SiH_4$ equal to or less than 5 with a high-frequency power set smaller than a high-frequency power in which said insulation film contains $H_2O$ with an amount of about 2.4 wt %; wherein said high-power frequency is smaller than 200 W;
    forming a nitride film on said insulation film in contact with said insulation film, without exposing a surface of said insulation film to the air;
    forming an interlayer insulation film so as to cover said nitride film; and
    forming a window exposing said silicide layer, by applying a dry etching process consecutively to said interlayer insulation film, said nitride film, and said insulation film.

* * * * *

UNITED STATES PATENT AND TRADEMARK OFFICE
CERTIFICATE OF CORRECTION

PATENT NO.         : 7,422,942 B2                                          Page 1 of 1
APPLICATION NO.    : 11/798366
DATED              : September 9, 2008
INVENTOR(S)        : Kousuke Suzuki et al.

It is certified that error appears in the above-identified patent and that said Letters Patent is hereby corrected as shown below:

Title Pg, Item (62) Related U.S. Application Data:
Change Item 62 "Division of Application No. 10/793,862, filed on March 8, 2004, now Patent No. 7,232,720" to be --Division of Application No. 10/793,862, filed on March 8, 2004, now Patent No. 7,232,720 which is a division of Application No. 09/045,118 filed on March 20, 1998 now Patent No. 6,878,594--

Signed and Sealed this

Tenth Day of February, 2009

JOHN DOLL
*Acting Director of the United States Patent and Trademark Office*